United States Patent
Shinno et al.

(10) Patent No.: US 11,390,953 B2
(45) Date of Patent: *Jul. 19, 2022

(54) VAPOR DEPOSITION MASK BASE MATERIAL, VAPOR DEPOSITION MASK BASE MATERIAL MANUFACTURING METHOD, AND VAPOR DEPOSITION MASK MANUFACTURING METHOD

(71) Applicant: TOPPAN PRINTING CO., LTD., Tokyo (JP)

(72) Inventors: Mikio Shinno, Tokyo (JP); Reiji Terada, Tokyo (JP); Kiyoaki Nishitsuji, Tokyo (JP); Masashi Kurata, Tokyo (JP); Kenta Takeda, Tokyo (JP); Naoko Mikami, Tokyo (JP); Sumika Akiyama, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/985,229

(22) Filed: Aug. 5, 2020

(65) Prior Publication Data

US 2020/0362465 A1 Nov. 19, 2020

Related U.S. Application Data

(63) Continuation of application No. 16/025,857, filed on Jul. 2, 2018, now Pat. No. 10,767,266, which is a (Continued)

(30) Foreign Application Priority Data

Apr. 14, 2016 (JP) .............................. JP2016-081362

(51) Int. Cl.
*B21D 1/00* (2006.01)
*C23F 1/02* (2006.01)
(Continued)

(52) U.S. Cl.
CPC .................. *C23F 1/02* (2013.01); *B21B 1/38* (2013.01); *C23C 14/042* (2013.01); *C23C 14/24* (2013.01);
(Continued)

(58) Field of Classification Search
None
See application file for complete search history.

(56) References Cited

U.S. PATENT DOCUMENTS 6,620,554 B1 9/2003 Komatsu et al.
10,697,069 B2 6/2020 Shinno
(Continued)

FOREIGN PATENT DOCUMENTS

CN 1534383 A 10/2004
CN 102851638 A 1/2013
(Continued)

OTHER PUBLICATIONS

International Preliminary Report on Patentability dated Oct. 16, 2018 in International Patent Application No. PCT/JP2017/015357, 7 pages.
(Continued)

*Primary Examiner* — Seth Dumbris
*Assistant Examiner* — Kim S. Horger
(74) *Attorney, Agent, or Firm* — Squire Patton Boggs (US) LLP

(57) ABSTRACT

The ratio of the difference between a surface distance L at each of the different positions in a width direction DW of a metal sheet and a minimum surface distance Lm to the minimum surface distance Lm is an elongation difference ratio. The elongation difference ratio in a center section in the width direction DW of the metal sheet is less than or equal to $3 \times 10^{-5}$. The elongation difference ratios in two edge sections in the width direction DW of the metal sheet are less
(Continued)

than or equal to $15 \times 10^{-5}$. The elongation difference ratio in at least one of the two edge sections in the width direction DW of the metal sheet is less than the elongation difference ratio in the center section in the width direction of the metal sheet.

6 Claims, 13 Drawing Sheets

Related U.S. Application Data continuation of application No. PCT/JP2017/015357, filed on Apr. 14, 2017.

(51) Int. Cl.
    *C23F 1/28*         (2006.01)
    *C23C 14/24*       (2006.01)
    *B21B 1/38*         (2006.01)
    *C23C 14/04*       (2006.01)
    *C23F 1/16*         (2006.01)
    *C22C 19/03*       (2006.01)
    *C22C 38/08*       (2006.01)

(52) U.S. Cl.
    CPC ................. *C23F 1/16* (2013.01); *C23F 1/28* (2013.01); *B21B 2261/06* (2013.01); *C22C 19/03* (2013.01); *C22C 38/08* (2013.01)

(56) References Cited

U.S. PATENT DOCUMENTS

| | | | |
|---|---|---|---|
| 10,767,266 | B2 | 9/2020 | Shinno et al. |
| 2004/0018372 | A1 | 1/2004 | Komatsu et al. |
| 2004/0202821 | A1 | 10/2004 | Kim et al. |
| 2006/0103289 | A1 | 5/2006 | Kim et al. |
| 2013/0040047 | A1 | 2/2013 | Karaki |
| 2014/0377903 | A1 | 12/2014 | Takeda et al. |
| 2015/0290667 | A1* | 10/2015 | Mizumura ............ B05C 21/005 118/504 |
| 2016/0208392 | A1 | 7/2016 | Ikenaga et al. |
| 2016/0237546 | A1 | 8/2016 | Ikenaga et al. |
| 2016/0315286 | A1 | 10/2016 | Kuroki et al. |
| 2017/0092862 | A1 | 3/2017 | Obata et al. |
| 2018/0312979 | A1 | 11/2018 | Shinno et al. |
| 2019/0071758 | A1 | 3/2019 | Okamoto |
| 2019/0078194 | A1 | 3/2019 | Shinno et al. |
| 2019/0112699 | A1 | 4/2019 | Shinno |
| 2019/0112715 | A1 | 4/2019 | Shinno |
| 2020/0362464 | A1 | 11/2020 | Shinno |

FOREIGN PATENT DOCUMENTS

| | | |
|---|---|---|
| CN | 104854254 A | 8/2015 |
| CN | 105492654 A | 4/2016 |
| CN | 107849682 A | 3/2018 |
| JP | H05-290724 A | 11/1993 |
| JP | H09-209176 A | 8/1997 |
| JP | H11-229040 A | 8/1999 |
| JP | 2005-158319 A | 6/2005 |
| JP | 2006-331973 A | 12/2006 |
| JP | 2009-299170 A | 12/2009 |
| JP | 2010-214447 A | 9/2010 |
| JP | 2014-148743 A | 8/2014 |
| JP | 2015-055007 A | 3/2015 |
| JP | 2015-129334 A | 7/2015 |
| JP | 2015-193871 A | 11/2015 |
| JP | 2016-000840 A | 1/2016 |
| JP | 2017-064763 A | 4/2017 |
| JP | 2017-064764 A | 4/2017 |
| JP | 6120038 B1 | 4/2017 |
| JP | 2017-088936 A | 5/2017 |
| JP | 2017-181893 A | 10/2017 |
| JP | 2017-181894 A | 10/2017 |
| KR | 10-2015-0103654 | 9/2015 |
| TW | 514678 B | 12/2002 |
| WO | WO 2014/109393 A1 | 7/2014 |
| WO | WO 2017/179719 A1 | 10/2017 |
| WO | WO2017/154981 A1 | 2/2019 |

OTHER PUBLICATIONS

Notification of Reason for Refusal issued by the Korean Intellectual Property Office in Korean Application No. 10-2017-7037898 dated May 4, 2018.
Second Office Action dated Aug. 16, 2021 in Chinese Patent Application No. 201910317040.1, 12 pages.
Rejection Decision dated Jan. 19, 2022 in Chinese Patent Application No. 201910317040.1, 16 pages.
Tsukada et al., "Evaluation of Two- and Three-Dimensional Surface Roughness Profiles and Their Confidence", Wear, 1986, vol. 109, p. 69-78, 10 pages.
"Handbook for Processing Heavy Non-Ferrous Metals, vol. 2", "Handbook for Processing Heavy Non-Ferrous Metals", p. 24, Metallurgical Industry Press, published on Apr. 30, 1974, 8 pages.
JIS B 0601:1982, "Definition And Designation Of Surface Roughness", 27 pages.
JIS B 0601:2001 (ISO 4287:1997), "Geometrical Product Specification (GPS)—Surface Texture: Profile Method—Terms, Definitions And Surface Texture Parameters", 53 pages.
ISO 25178-2:2012, "Geometrical Product Specifications (Gps)—Surface Texture: Areal—Part 2: Terms, Definitions And Surface Texture Parameters", 24 pages.
Final Office Action dated Apr. 27, 2020, in U.S. Appl. No. 15/928,376, 9 pages.
Kihara et al., "Recent rolling mills for sheets", Journal of the Japanese Society of Metals, vol. 25, No. 10 (1986), pp. 832-839, with English language translation.
Kira et al., "Flatness Control System of Cold Rolling Process with Pneumatic Bearing Type Shape Roll", English abstract, 7 pages, Journal of IHI Technologies, vol. 48, No. 2 (Jun. 2008), pp. 129-135.
Non-Final Office Action dated Jul. 16, 2019, in U.S. Appl. No. 15/928,357, 11 pages.
Notification for the Opinion of Examination, Intellectual Property Office Ministry of Economic Affairs, Taiwan Patent Application No. 107136383, with translation ofTaiwan Office Action, 13 pages, dated Aug. 12, 2021.
Office Action dated Sep. 23, 2019, in related Chinese Patent Application No. 201610561108.7, 18 pages, with its English translation.
Trial Decision on Appeal against Decision to Reject Application dated Aug. 26, 2019 in Korean Trial No. 2019-1152, 32 pages.
Trial Decision on Appeal against Decision to Reject Application dated Aug. 26, 2019 in Korean Trial No. 2019-1153, 31 pages.

* cited by examiner

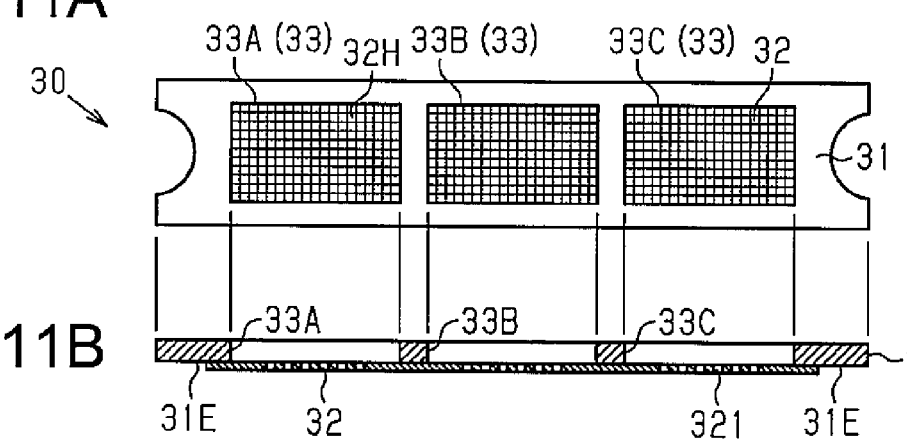

Fig.20A Sheet preparation
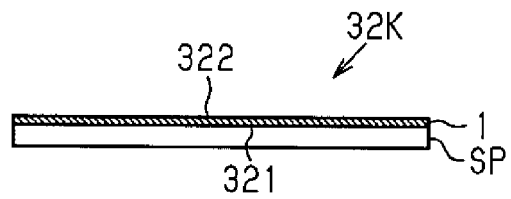
Fig.20B Resist layer formation
Fig.20C Exposure and development
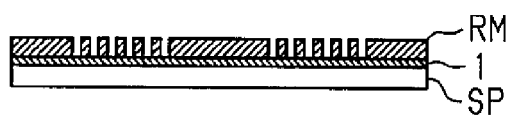
Fig.20D Etching
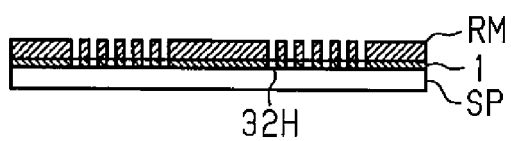
Fig.20E Resist removal
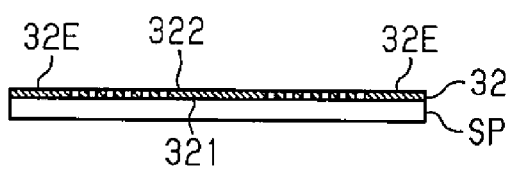
Fig.20F Joining A
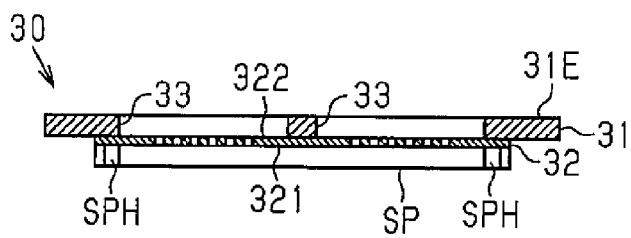
Fig.20G Joining B
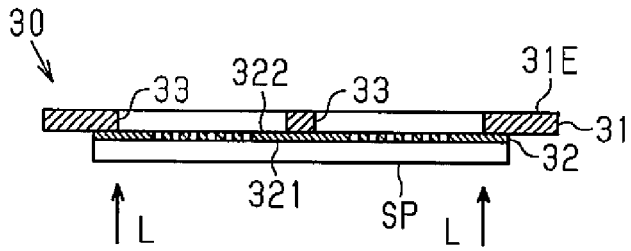
Fig.20H Joining C
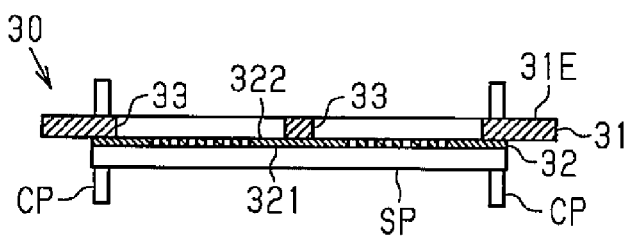

Resist layer formation

Resist mask formation

Electrolysis

Resist removal

Joining and peeling

Resist layer formation

Resist mask formation

Electrolysis

Resist removal

Peeling

Joining and peeling

VAPOR DEPOSITION MASK BASE MATERIAL, VAPOR DEPOSITION MASK BASE MATERIAL MANUFACTURING METHOD, AND VAPOR DEPOSITION MASK MANUFACTURING METHOD

CROSS-REFERENCE TO RELATED APPLICATION

This application is a continuation of application Ser. No. 16/025,857, filed Jul. 2, 2018, which is a continuation of International Application No. PCT/JP2017/015357 filed on Apr. 14, 2017, which claims priority to Japanese Application No. JP-2016-081362, filed on Apr. 14, 2016, all of which are incorporated verbatim herein by reference in their entirety, including the specifications, drawings and claims.

BACKGROUND

The present disclosure relates to a vapor deposition mask substrate, a method for manufacturing a vapor deposition mask substrate, and a method for manufacturing a vapor deposition mask.

A vapor deposition mask includes a first surface and a second surface. The first surface faces a target such as a substrate, and the second surface is opposite to the first surface. The holes extending through the first and second surfaces each include a first opening, which is located in the first surface, and a second opening, which is located in the second surface. The vapor deposition material entering the holes through the second openings forms on the target a pattern corresponding to the position and shape of the first openings (see Japanese Laid-Open Patent Publication No. 2015-055007, for example).

Each hole of the vapor deposition mask has a cross-sectional area that increases from the first opening toward the second opening. This increases the amount of vapor deposition material entering the hole through the second opening so that an adequate amount of vapor deposition material reaches the first opening. However, some of the vapor deposition material entering the hole through the second opening adheres to the wall surface defining the hole, failing to reach the first opening. The vapor deposition material adhering to the wall surface defining the hole may prevent other vapor deposition material from reaching the first opening, lowering the dimensional accuracy of the pattern.

To reduce the amount of vapor deposition material adhering to the wall surfaces defining holes and thereby increase the dimensional accuracy of the pattern, a structure has been contemplated in which the thickness of the vapor deposition mask is reduced to reduce the areas of the wall surfaces defining holes. In order to reduce the thickness of the vapor deposition mask, a technique is used to reduce the thickness of the metal sheet for manufacturing the vapor deposition mask. However, in the process of etching the metal sheet to form holes, a smaller thickness of the metal sheet results in a smaller amount of metal to be etched. This shortens the permissible range of the duration for which the metal sheet is in contact with the etchant, increasing the difficulty in achieving the required dimensional accuracy of the first and second openings. In particular, the manufacturing of metal sheet involves a rolling step, in which the base material is drawn with rolls, or an electrolysis step, in which the metal sheet deposited on an electrode is peeled off from the electrode. Accordingly, the metal sheet has an undulated shape in which different positions in the metal sheet have different elongation difference ratios. Different positions of an undulated metal sheet are brought into contact with the etchant often for different durations. As described above, although a thinner vapor deposition mask reduces the amount of vapor deposition material adhering to the wall surfaces defining holes and thereby increases the dimensional accuracy of the patterns in repeated vapor deposition, such a vapor deposition mask tends to lack the required dimensional accuracy of the holes, causing another problem that the required dimensional accuracy of the pattern in each vapor deposition is difficult to achieve.

SUMMARY

It is an objective of the present disclosure to provide a vapor deposition mask substrate, a method for manufacturing a vapor deposition mask substrate, and a method for manufacturing a vapor deposition mask that increase the accuracy of the patterns formed by vapor deposition.

To achieve the foregoing objectives, a vapor deposition mask substrate is provided, which is a metal sheet that has a shape of a strip and is configured to be etched to include a plurality of holes so that the metal sheet is used to manufacture a vapor deposition mask. The metal sheet has shapes that are taken along a longitudinal direction of the metal sheet at different positions in a width direction of the metal sheet and differ from one another, each of the shapes being an undulated shape including protrusions and depressions repeating in the longitudinal direction of the metal sheet. A length in the longitudinal direction of a surface of the metal sheet is a surface distance. A minimum value of surface distances at different positions in the width direction of the metal sheet is a minimum surface distance. A ratio of a difference between a surface distance at each of the different positions in the width direction of the metal sheet and the minimum surface distance to the minimum surface distance is an elongation difference ratio. The elongation difference ratio in a center section in the width direction of the metal sheet is less than or equal to $3 \times 10^{-5}$. The elongation difference ratios in two edge sections in the width direction of the metal sheet are less than or equal to $15 \times 10^{-5}$. The elongation difference ratio in at least one of the two edge sections in the width direction of the metal sheet is less than the elongation difference ratio in the center section in the width direction of the metal sheet.

In the above-described vapor deposition mask substrate, the elongation difference ratio in only one of the two edge sections in the width direction of the metal sheet may be less than the elongation difference ratio in the center section in the width direction of the metal sheet, and a difference between maximum values of the elongation difference ratios in the two edge sections may be between $3 \times 10^{-5}$ and $11 \times 10^{-5}$ inclusive.

In the above-described vapor deposition mask substrate, the elongation difference ratios in the two edge sections in the width direction of the metal sheet may be less than the elongation difference ratio in the center section in the width direction of the metal sheet, and the elongation difference ratios in the two edge sections and the elongation difference ratio in the center section may be less than or equal to $1 \times 10^{-5}$.

To achieve the foregoing objective, a method for manufacturing a vapor deposition mask substrate is provided. The vapor deposition mask substrate is a metal sheet that has a shape of a strip and is configured to be etched to include a plurality of holes so that the metal sheet is used to manufacture a vapor deposition mask. The method includes obtaining the metal sheet by rolling a base material. The metal sheet has shapes that are taken along a longitudinal direction of the metal sheet at different positions in a width direction of the metal sheet and differ from one another, each of the shapes being an undulated shape including protrusions and depressions repeating in the longitudinal direction of the metal sheet. A length in the longitudinal direction of a surface of the metal sheet is a surface distance. A minimum value of surface distances at different positions in the width direction of the metal sheet is a minimum surface distance. A ratio of a difference between a surface distance at each of the different positions in the width direction of the metal sheet and the minimum surface distance to the minimum surface distance is an elongation difference ratio. Obtaining the metal sheet includes rolling the base material such that: the elongation difference ratio in a center section in the width direction of the metal sheet is less than or equal to $3 \times 10^{-5}$; the elongation difference ratios in two edge sections in the width direction of the metal sheet are less than or equal to $15 \times 10^{-5}$; and the elongation difference ratio in at least one of the two edge sections in the width direction of the metal sheet is less than the elongation difference ratio in the center section in the width direction of the metal sheet.

To achieve the foregoing objective, a method for manufacturing a vapor deposition mask is provided. The method includes forming a resist layer on a metal sheet having a shape of a strip and forming a plurality of holes in the metal sheet by etching using the resist layer as a mask to form a mask portion. The metal sheet has shapes that are taken along a longitudinal direction of the metal sheet at different positions in a width direction of the metal sheet and differ from one another, each of the shapes being an undulated shape including protrusions and depressions repeating in the longitudinal direction of the metal sheet. A length in the longitudinal direction of a surface of the metal sheet is a surface distance. A minimum value of surface distances at different positions in the width direction of the metal sheet is a minimum surface distance. A ratio of a difference between a surface distance at each of the different positions in the width direction of the metal sheet and the minimum surface distance to the minimum surface distance is an elongation difference ratio. The metal sheet is obtained such that: the elongation difference ratio in a center section in the width direction of the metal sheet is less than or equal to $3 \times 10^{-5}$; the elongation difference ratios in two edge sections in the width direction of the metal sheet are less than or equal to $15 \times 10^{-5}$; and the elongation difference ratio in at least one of the two edge sections in the width direction of the metal sheet is less than the elongation difference ratio in the center section in the width direction of the metal sheet.

In the above-described method for manufacturing a vapor deposition mask, the mask portion may be one of a plurality of mask portions. The mask portions may each include a separate side surface including openings of some of the holes. The method may further include joining a single frame portion to the side surfaces such that the single frame portion surrounds the holes in the mask portions.

BRIEF DESCRIPTION OF THE DRAWINGS

FIG. 11A is a plan view showing another example of the planar structure of a vapor deposition mask.

FIG. 11B is a cross-sectional view showing another example of the cross-sectional structure of the vapor deposition mask.

FIGS. 20A to 20H are process diagrams for illustrating an example of a method for manufacturing a vapor deposition mask.

FIGS. 21A to 20E are process diagrams for illustrating an example of a method for manufacturing a vapor deposition mask.

DESCRIPTION OF EXEMPLARY EMBODIMENTS

Referring to FIGS. 1 to 29, embodiments of a vapor deposition mask substrate, a method for manufacturing a vapor deposition mask substrate, and a method for manufacturing a vapor deposition mask are now described.

[Structure of Vapor Deposition Mask]

Figure 1:
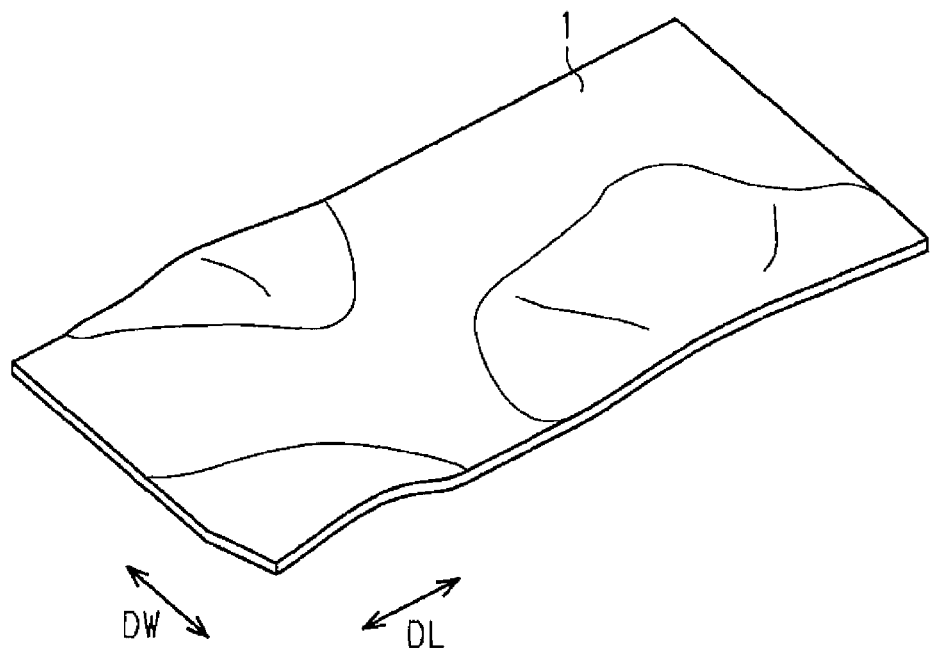
FIG. 1 is a perspective view showing the structure of a vapor deposition mask substrate.

As shown in FIG. 1, a vapor deposition mask substrate 1 is a metal sheet having the shape of a strip. The vapor deposition mask substrate 1 has an undulated shape of protrusions and depressions repeating in the longitudinal direction DL at each of different positions in the width direction DW, which is the transverse direction. The undulated shapes at different positions in the width direction DW of the vapor deposition mask substrate 1 differ from one another. For illustrative purposes, the undulated shapes of the vapor deposition mask substrate 1 are exaggerated in FIG. 1. The thickness of the vapor deposition mask substrate 1 is between 15 μm and 50 μm inclusive. The consistency in thickness of the vapor deposition mask substrate 1 is such that the ratio of the difference between the maximum thickness and the minimum thickness to the average thickness is less than or equal to 5%, for example.

The vapor deposition mask substrate 1 may be made of nickel or a nickel-iron alloy, such as a nickel-iron alloy containing at least 30 mass % of nickel. In particular, the vapor deposition mask substrate 1 may be made of Invar, which is mainly composed of an alloy containing 36 mass % of nickel and 64 mass % of iron. When the main component is the alloy of 36 mass % of nickel and 64 mass % of iron, the remainder contains additives such as chromium, manganese, carbon, and cobalt. When the vapor deposition mask substrate 1 is made of Invar, the vapor deposition mask substrate 1 has a thermal expansion coefficient of about $1.2 \times 10^{-6}/°C$. The vapor deposition mask substrate 1 having such a thermal expansion coefficient produces a mask that changes its size due to thermal expansion to an extent equivalent to a glass substrate. Thus, a glass substrate is suitably used as a vapor deposition target.

[Elongation Difference Ratio]

Figure 2:
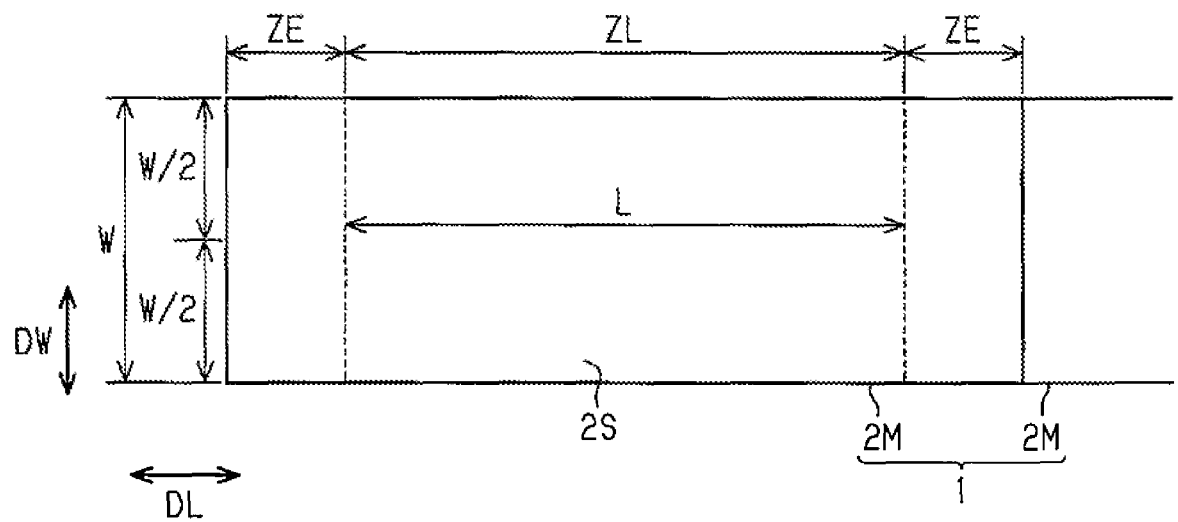
FIG. 2 is a plan view showing the planar structure of a vapor deposition mask substrate together with measurement substrates.

As shown in FIG. 2, the length in the longitudinal direction DL of the surface of the vapor deposition mask substrate 1 at each of different positions in the width direction DW of the vapor deposition mask substrate 1 is a surface distance L. To measure surface distances L, a slitting step is first performed in which the vapor deposition mask substrate 1 is cut across in the width direction DW (cut across the width) so that a measurement substrate 2M is cut out as a section of the vapor deposition mask substrate 1 in the longitudinal direction DL of the vapor deposition mask substrate 1. The dimension W in the width direction DW of the measurement substrate 2M is equal to the dimension in the width direction DW of the vapor deposition mask substrate 1. Then, the heights of the surface 2S of the measurement substrate 2M are measured at different positions in the longitudinal direction DL. The area in which heights are measured at different positions in the longitudinal direction DL is a measurement area ZL, which is an area excluding non-measurement areas ZE located at the two ends in the longitudinal direction DL of the measurement substrate 2M. The length in the longitudinal direction DL of each non-measurement area ZE corresponds to the area that can have an undulated shape that is different from that of the vapor deposition mask substrate 1 and formed when the vapor deposition mask substrate 1 is cut in the slitting step. The non-measurement areas ZE are excluded from the height measurement. The length in the longitudinal direction DL of each non-measurement area ZE is 100 mm, for example.

Figure 3:
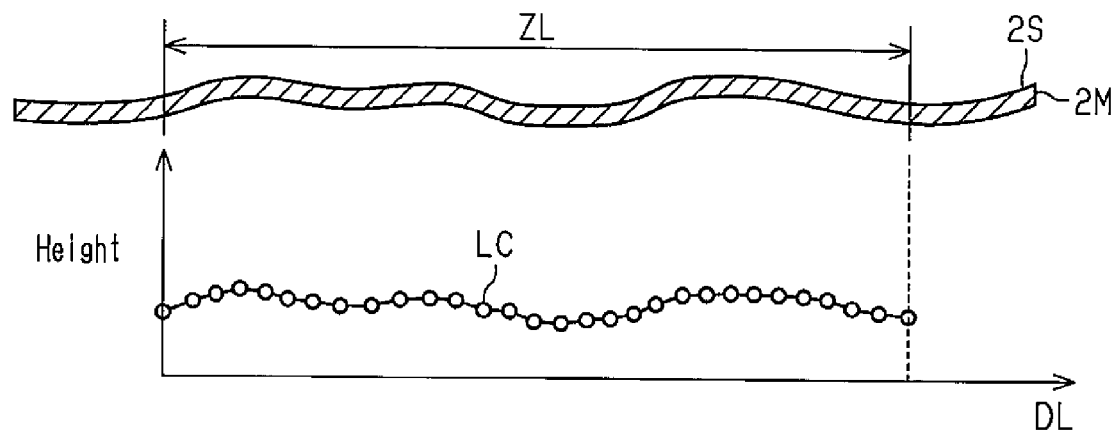
FIG. 3 is a diagram showing a graph for illustrating surface distances together with the cross-sectional structure of a measurement substrate.

FIG. 3 is a graph showing an example of the heights at different positions in the longitudinal direction DL of the measurement substrate 2M together with the cross-sectional structure of a cross-section taken in the longitudinal direction DL of the measurement substrate 2M.

As shown in FIG. 3, the different positions in the longitudinal direction DL at which heights are measured are set at intervals that enable representation of the undulated shape of protrusions and depressions of the vapor deposition mask substrate 1. The positions in the longitudinal direction DL at which heights are measured are at intervals of 1 mm in the longitudinal direction DL, for example. The length of the polygonal line LC connecting the heights at different positions in the longitudinal direction DL is calculated as a surface distance L. An elongation difference ratio of the vapor deposition mask substrate 1 is defined by Expression 1 below. That is, when the minimum value of the surface distances L at different positions in the width direction DW of the vapor deposition mask substrate 1 is a minimum surface distance Lm, the ratio of the difference between a surface distance L and the minimum surface distance Lm to the minimum surface distance Lm is the elongation difference ratio.

$$\text{Elongation Difference Ratio} = (L - Lm)/Lm \quad \text{(Expression 1)}$$

Figure 4:
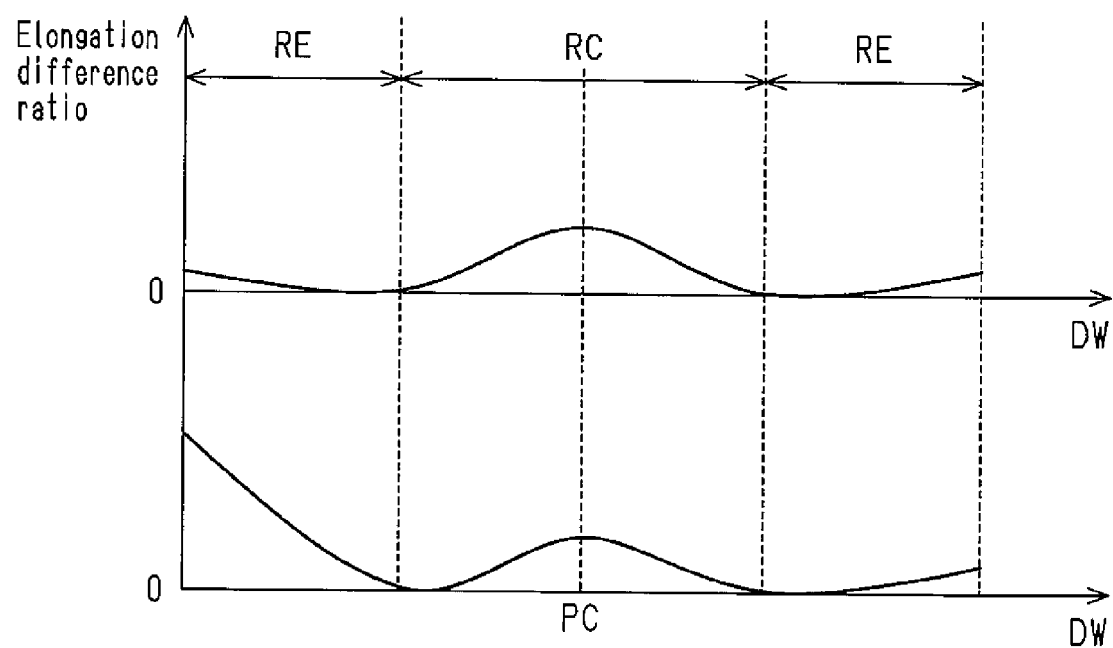
FIG. 4 is a graph for illustrating elongation difference ratios.

FIG. 4 shows the elongation difference ratios at different positions in the width direction DW of the vapor deposition mask substrate 1. The upper solid line in FIG. 4 shows an example in which the elongation difference ratios in the center section in the width direction DW are greater than the elongation difference ratios in the other sections. The lower solid line in FIG. 4 shows an example in which elongation difference ratios in an edge section in the width direction DW are greater than the elongation difference ratios in the other sections.

As shown in FIG. 4, the greatest elongation difference ratio of the vapor deposition mask substrate 1 is measured in the center section RC in the width direction DW, while the smallest elongation difference ratio is measured near the boundaries between the center section RC and the edge sections RE. The elongation difference ratios of the vapor deposition mask substrate 1 increase from the center section RC toward the edges of the two edge sections RE in the width direction DW. The center in the width direction DW of the center section RC is the center PC in the width direction DW of the vapor deposition mask substrate 1. The length in the width direction DW of the center section RC in the width direction DW is 40% of the length in the width direction DW of the vapor deposition mask substrate 1. The length in the width direction DW of each edge section RE in the width direction DW is 30% of the length in the width direction DW of the vapor deposition mask substrate 1. The elongation difference ratios of this vapor deposition mask substrate 1 satisfy the following three conditions.

[Condition 1] The elongation difference ratios in at least one of the two edge sections RE are less than the elongation difference ratios in the center section RC in the width direction DW.

[Condition 2] The elongation difference ratios in the center section RC are less than or equal to $3 \times 10^{-5}$.

[Condition 3] The elongation difference ratios in each of the two edge sections RE are less than or equal to $15 \times 10^{-5}$. The elongation difference ratios in the edge sections RE are preferably less than or equal to $10 \times 10^{-5}$.

As indicated by the upper solid line in FIG. 4, in a vapor deposition mask substrate 1 that is an example satisfying Condition 1 and in which the elongation difference ratios in the edge sections RE are less than the elongation difference ratios in the center section RC, the number of repeated protrusions and depressions in the surface and the height variation of the surface are greater in the center section RC than in the edge sections RE. This vapor deposition mask substrate 1 allows the liquid supplied to the surface of the vapor deposition mask substrate 1 to flow easily from the center section RC to the edge sections RE and also from the edge sections RE to the outside of the vapor deposition mask substrate 1.

As indicated by the lower solid line in FIG. 4, in a vapor deposition mask substrate 1 that is another example satisfying Condition 1 and in which the elongation difference ratios in only the first edge section RE are less than the elongation difference ratios in the center section RC, the number of repeated protrusions and depressions in the surface and the height variation of the surface are greater in the second edge section RE than in the center section RC and the first edge section RE. This vapor deposition mask substrate 1 allows the liquid supplied to the surface of the vapor deposition mask substrate 1 to flow easily from the second edge section RE to the first edge section RE and also from the first edge section RE to the outside of the vapor deposition mask substrate 1.

The liquid supplied to the surface of the vapor deposition mask substrate 1 may be developing solution for developing the resist layer on the surface of the vapor deposition mask substrate 1 and cleaning solution for removing the developing solution from the surface. The liquid supplied to the surface of the vapor deposition mask substrate 1 may also be etchant for etching the vapor deposition mask substrate 1 and cleaning solution for removing the etchant from the surface. Further, the liquid supplied to the surface of the vapor deposition mask substrate 1 may be stripping solution for stripping the resist layer remaining on the surface of the vapor deposition mask substrate 1 after etching, and cleaning solution for removing the stripping solution from the surface. The structures described above, in which the flow of liquid supplied to the surface of the vapor deposition mask substrate 1 is unlikely to stagnate, increase the consistency of the processing using liquid on the surface of the vapor deposition mask substrate 1.

In a vapor deposition mask substrate 1 that is an example failing to satisfy Condition 1 and in which elongation difference ratios in the edge sections RE are greater than the elongation difference ratios in the center section RC, the liquid supplied to the surface of the vapor deposition mask substrate 1 easily flows not only from the edge sections RE to the outside of the vapor deposition mask substrate 1, but also from the edge sections RE to the center section RC. This tends to create liquid pools in the center section RC, which may reduce the consistency of the processing using liquid on the surface of the vapor deposition mask substrate 1. As such, the structures satisfying Condition 1 and the advantages of these structures are achievable only by identifying the problem in surface processing using liquid that occurs due to the difference between the elongation difference ratios in the center section RC and the elongation difference ratios in the edge sections RE.

[Structure of Mask Device]

Figure 5:
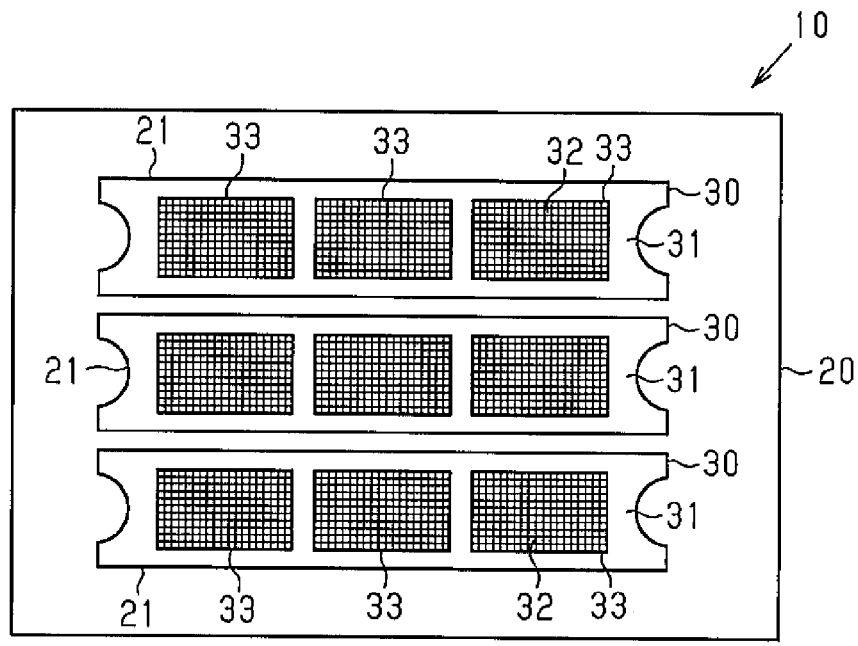
FIG. 5 is a plan view showing the planar structure of a mask device.
Figure 6:
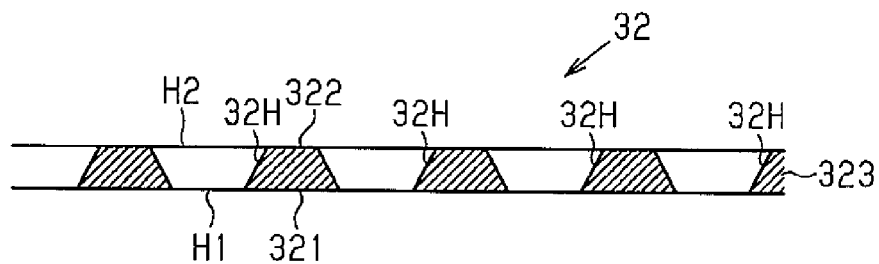
FIG. 6 is a partial cross-sectional view showing an example of the cross-sectional structure of a mask portion.
Figure 7:
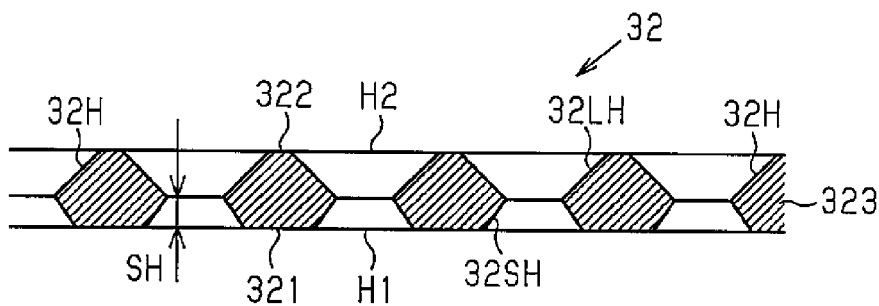
FIG. 7 is a partial cross-sectional view showing another example of the cross-sectional structure of a mask portion.

FIG. 5 is a plan view schematically showing the planar structure of a mask device including a vapor deposition mask manufactured using the vapor deposition mask substrate 1. FIG. 6 is a cross-sectional view showing an example of the cross-sectional structure of a mask portion of a vapor deposition mask. FIG. 7 is a cross-sectional view showing another example of the cross-sectional structure of a mask portion of a vapor deposition mask. The number of the vapor deposition masks in the mask device and the number of mask portions in a vapor deposition mask 30 shown are by way of example.

As shown in FIG. 5, a mask device 10 includes a main frame 20 and three vapor deposition masks 30. The main frame 20 has the shape of a rectangular frame and supports the vapor deposition masks 30. The main frame 20 is attached to a vapor deposition apparatus that performs vapor deposition. The main frame 20 includes main frame holes 21, which extend through the main frame 20 and extend substantially over the entire areas in which the vapor deposition masks 30 are placed.

The vapor deposition masks 30 include a plurality of frame portions 31, each having the shape of a planar strip, and three mask portions 32 in each frame portion 31. Each frame portion 31, which supports mask portions 32 and has the shape of a planar strip, is attached to the main frame 20. Each frame portion 31 includes frame holes 33, which extend through the frame portion 31 and extend substantially over the entire areas in which mask portions 32 are placed. The frame portion 31 has a higher rigidity than the mask portions 32 and is shaped as a frame surrounding the frame holes 33. The mask portions 32 are separately fixed by welding or adhesion to the frame inner edge sections of the frame portion 31 defining the frame holes 33.

As shown in FIG. 6, an example of a mask portion 32 is made of a mask plate 323. The mask plate 323 may be a single planar member made of a vapor deposition mask substrate 1 or a laminate of a single planar member made of a vapor deposition mask substrate 1 and a plastic sheet.

The mask plate 323 includes a first surface 321 and a second surface 322, which is opposite to the first surface 321. The first surface 321 faces the vapor deposition target, such as a glass substrate, when the mask device 10 is attached to a vapor deposition apparatus. The second surface 322 faces the vapor deposition source of the vapor deposition apparatus. The mask portion 32 includes a plurality of holes 32H extending through the mask plate 323. The wall surface defining each hole 32H is inclined with respect to the thickness direction of the mask plate 323 in a cross-sectional view. In a cross-sectional view, the wall surface defining each hole 32H may have a linear shape as shown in FIG. 6, a semicircular shape protruding outward of the hole 32H, or a complex curved shape having a plurality of bend points.

The mask plate 323 has a thickness of between 1 μm and 50 μm inclusive, preferably between 2 μm and 20 μm inclusive. The thickness of the mask plate 323 that is less than or equal to 50 μm causes the holes 32H formed in the mask plate 323 to have a depth of less than or equal to 50 μm. This thin mask plate 323 allows the wall surfaces defining the holes 32H to have small areas, thereby reducing the amount of vapor deposition material adhering to the wall surfaces defining the holes 32H.

The second surface 322 includes second openings H2, which are openings of the holes 32H. The first surface 321 includes first openings H1, which are openings of the holes 32H. The second openings H2 are larger than the first openings H1 in a plan view. Each hole 32H is a passage for the vapor deposition material sublimated from the vapor deposition source. The vapor deposition material sublimated from the vapor deposition source moves from the second openings H2 to the first openings H1. The second openings H2 that are larger than the first openings H1 increase the amount of vapor deposition material entering the holes 32H through the second openings H2. The area of each hole 32H in a cross-section taken along the first surface 321 may increase monotonically from the first opening H1 toward the second opening H2.

As shown in FIG. 7, another example of a mask portion 32 includes a plurality of holes 32H extending through the mask plate 323. The second openings H2 are larger than the first openings H1 in a plan view. Each hole 32H consists of a large hole 32LH, which includes a second opening H2, and a small hole 32SH, which includes a first opening H1. The large hole 32LH has a cross-sectional area that monotonically decreases from the second opening H2 toward the first surface 321. The small hole 32SH has a cross-sectional area that monotonically decreases from the first opening H1 toward the second surface 322. The section of the wall surface defining each hole 32H where the large hole 32LH meets the small hole 32SH at a middle point in the thickness direction of the mask plate 323 projects inward of the hole 32H. The distance between the first surface 321 and the protruding section of the wall surface defining the hole 32H is a step height SH. The example of cross-sectional structure shown in FIG. 6 has zero step height SH. To increase the amount of vapor deposition material reaching the first openings H1, the step height SH is preferably zero. In order for a mask portion 32 to have zero step height SH, the mask plate 323 should be thin enough so that wet etching from only one side of the vapor deposition mask substrate 1 achieves formation of holes 32H. For example, the mask plate 323 may have a thickness of less than or equal to 50 μm.

[Mask Portion Joining Structure]

Figure 8:
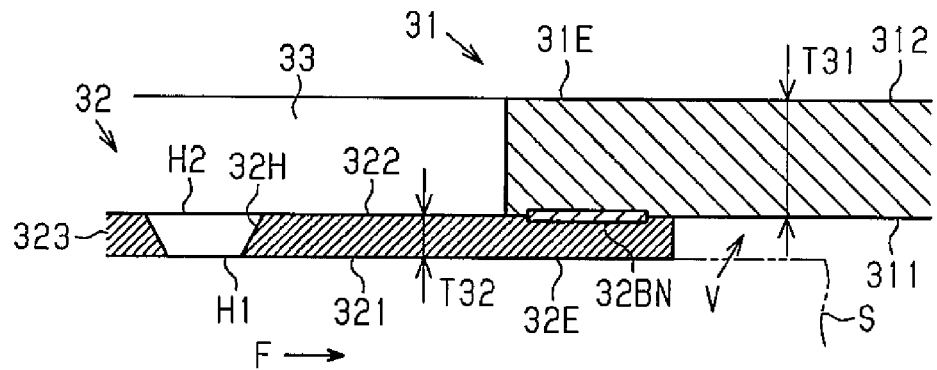
FIG. 8 is a partial cross-sectional view showing an example of the structure of joining between an edge of a mask portion and a frame portion.
Figure 9:
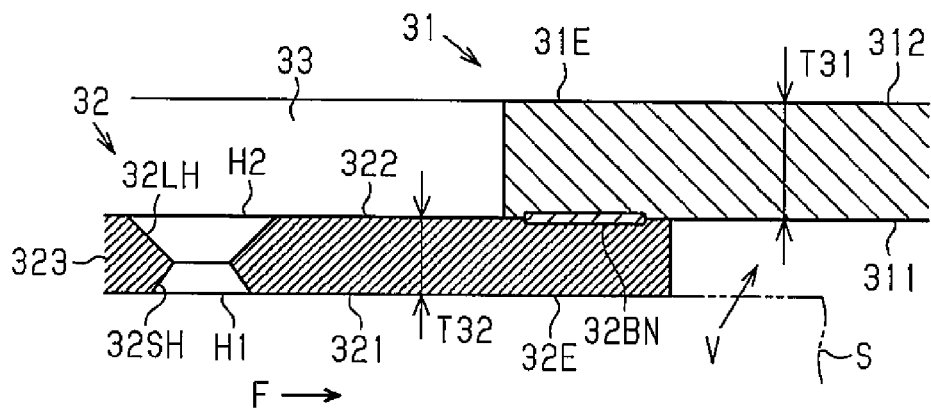
FIG. 9 is a partial cross-sectional view showing another example of the structure of joining between an edge of a mask portion and a frame portion.

FIG. 8 shows an example of the cross-sectional structure of joining between a mask portion 32 and a frame portion 31. FIG. 9 shows another example of the cross-sectional structure of joining between a mask portion 32 and a frame portion 31.

In the example shown in FIG. 8, the outer edge section 32E of a mask plate 323 is a region that is free of holes 32H. The part of the second surface 322 of the mask plate 323 included in the outer edge section 32E of the mask plate 323 is an example of a side surface of the mask portion and joined to the frame portion 31. The frame portion 31 includes inner edge sections 31E defining frame holes 33. Each inner edge section 31E includes a joining surface 311, which faces the mask plate 323, and a non-joining surface 312, which is opposite to the joining surface 311. The thickness T31 of the inner edge section 31E, that is, the distance between the joining surface 311 and the non-joining surface 312 is sufficiently larger than the thickness T32 of the mask plate 323, allowing the frame portion 31 to have a higher rigidity than the mask plate 323. In particular, the frame portion 31 has a high rigidity that limits sagging of the inner edge section 31E by its own weight and displacement of the inner edge section 31E toward the mask portion 32. The joining surface 311 of the inner edge section 31E includes a joining section 32BN, which is joined to the second surface 322.

The joining section 32BN extends continuously or intermittently along substantially the entire circumference of the inner edge section 31E. The joining section 32BN may be a welding mark formed by welding the joining surface 311 to the second surface 322, or a joining layer joining the joining surface 311 to the second surface 322. When the joining surface 311 of the inner edge section 31E is joined to the second surface 322 of the mask plate 323, the frame portion 31 applies stress F to the mask plate 323 that pulls the mask plate 323 outward. The main frame 20 also applies stress to the frame portion 31 that pulls the frame portion 31 outward. This stress corresponds to the stress F applied to the mask plate 323. Accordingly, the vapor deposition mask 30 removed from the main frame 20 is released from the stress caused by the joining between the main frame 20 and the frame portion 31, and the stress F applied to the mask plate 323 is relaxed. The position of the joining section 32BN in the joining surface 311 is preferably set such that the stress F isotropically acts on the mask plate 323. Such a position may be selected according to the shape of the mask plate 323 and the shape of the frame holes 33.

The joining surface 311 is a plane including the joining section 32BN and extends outward of the mask plate 323 from the outer edge section 32E of the second surface 322. In other words, the inner edge section 31E has a planar structure that virtually extends the second surface 322 outward, so that the inner edge section 31E extends from the outer edge section 32E of the second surface 322 toward the outside of the mask plate 323. Accordingly, in the area in which the joining surface 311 extends, a space V, which corresponds to the thickness of the mask plate 323, is likely to form around the mask plate 323. This limits physical interference between the vapor deposition target S and the frame portion 31 around the mask plate 323.

FIG. 9 shows another example in which the outer edge section 32E of the second surface 322 includes a region that is free of holes 32H. The outer edge section 32E of the second surface 322 includes a joining section 32BN with which the outer edge section 32E is joined to the joining surface 311 of the frame portion 31. The frame portion 31 applies stress F to the mask plate 323 the pulls the mask plate 323 outward. The frame portion 31 also creates a space V, which corresponds to the thickness of the mask plate 323, in the area where the joining surface 311 extends.

[Quantity of Mask Portions]

Figure 10A:
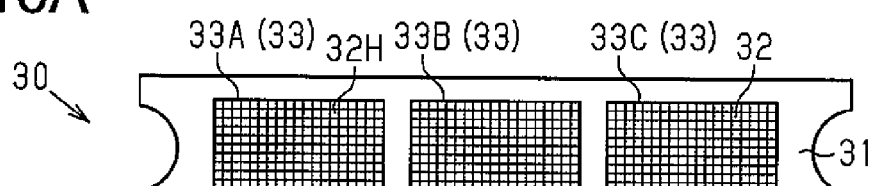
FIG. 10A is a plan view showing an example of the planar structure of a vapor deposition mask.
Figure 10B:
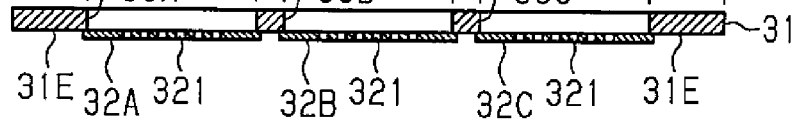
FIG. 10B is a cross-sectional view showing an example of the cross-sectional structure of the vapor deposition mask.

FIGS. 10A and 10B show an example of the relationship between the quantity of holes 32H in a vapor deposition mask 30 and the quantity of holes 32H in a mask portion 32. FIGS. 11A and 11B show another example of the relationship between the quantity of holes 32H in a vapor deposition mask 30 and the quantity of holes 32H in a mask portion 32.

FIG. 10A shows an example in which the frame portion 31 includes three frame holes 33. As shown in FIG. 10B, the vapor deposition mask 30 of this example includes one mask portion 32 in each of the frame holes 33. The inner edge section 31E defining the frame hole 33A is joined to a mask portion 32A, the inner edge section 31E defining the frame hole 33B is joined to another mask portion 32B, and the inner edge section 31E defining the frame hole 33C is joined to the other mask portion 32C.

The vapor deposition mask 30 is used repeatedly for a plurality of vapor deposition targets. Thus, the position and structure of the holes 32H in the vapor deposition mask 30 need to be highly accurate. In the structure shown in FIGS. 10A and 10B, the quantity of holes 32H required in one frame portion 31 is divided into three mask portions 32. Any partial deformation of one of the mask portions 32 in such a structure requires a smaller new mask portion 32 for replacement of the deformed mask portion 32, as compared with a structure in which the quantity of the holes 32H required in one frame portion 31 is assigned to a single mask portion. This helps reduce the number of vapor deposition masks 30 to be manufactured or repaired and the associated consumption of various materials. The position and structure of the holes 32H are preferably determined while the stress F is applied, that is, while the mask portions 32 are joined to the frame portion 31. In this respect, the joining section 32BN is preferably structured such that a deformed mask portion 32 is replaceable by a new mask portion 32. In addition, the yield of mask portions 32 decreases when the thickness of the mask plate 323 forming the mask portions 32 and the size of the holes 32H are smaller. Thus, the structure in which each frame hole 33 has one mask portion 32 is particularly suitable for a vapor deposition mask 30 that requires high-resolution mask portions 32.

FIG. 11A shows an example in which the frame portion 31 includes three frame holes 33. As shown in FIG. 11B, the vapor deposition mask 30 of this example includes one mask portion 32, which is common to the frame holes 33. The inner edge section 31E defining the frame hole 33A, the inner edge section 31E defining the frame hole 33B, and the inner edge section 31E defining the frame hole 33C are joined to the common mask portion 32.

The structure in which the quantity of the holes 32H required in one frame portion 31 is assigned to a single mask portion 32 involves only one mask portion 32 joined to the frame portion 31. This reduces the load required for joining between the frame portion 31 and the mask portion 32. In addition, the yield of mask portions 32 tends to increase when the thickness of the mask plate 323 forming the mask portions 32 and the size of the holes 32H are greater. Thus, the structure including a mask portion 32 common to the frame holes 33 is particularly suitable for a vapor deposition mask 30 that needs to have a low-resolution mask portion 32.

[Method for Manufacturing Vapor Deposition Mask Substrate]

Figure 12:
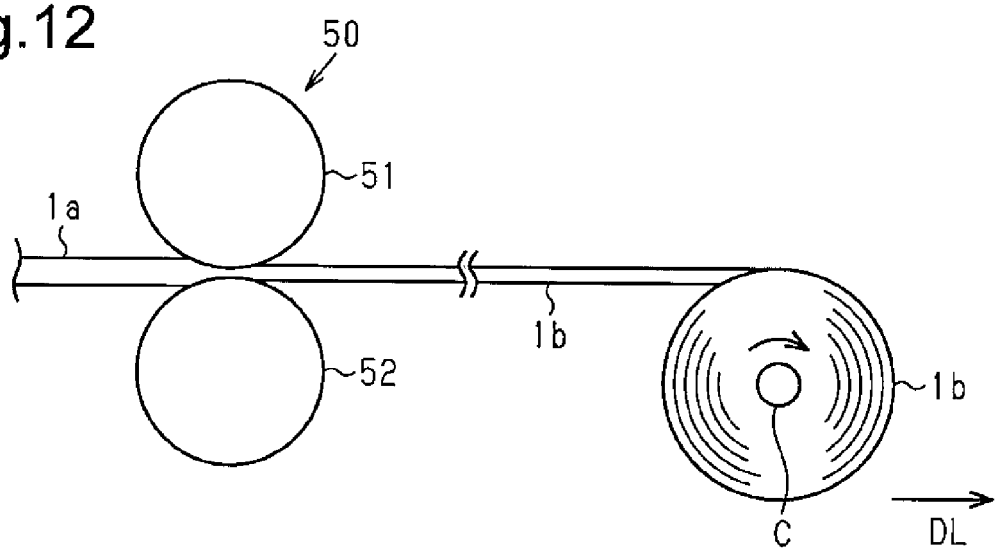
FIG. 12 is a process diagram showing a rolling step for manufacturing a vapor deposition mask substrate.
Figure 13:
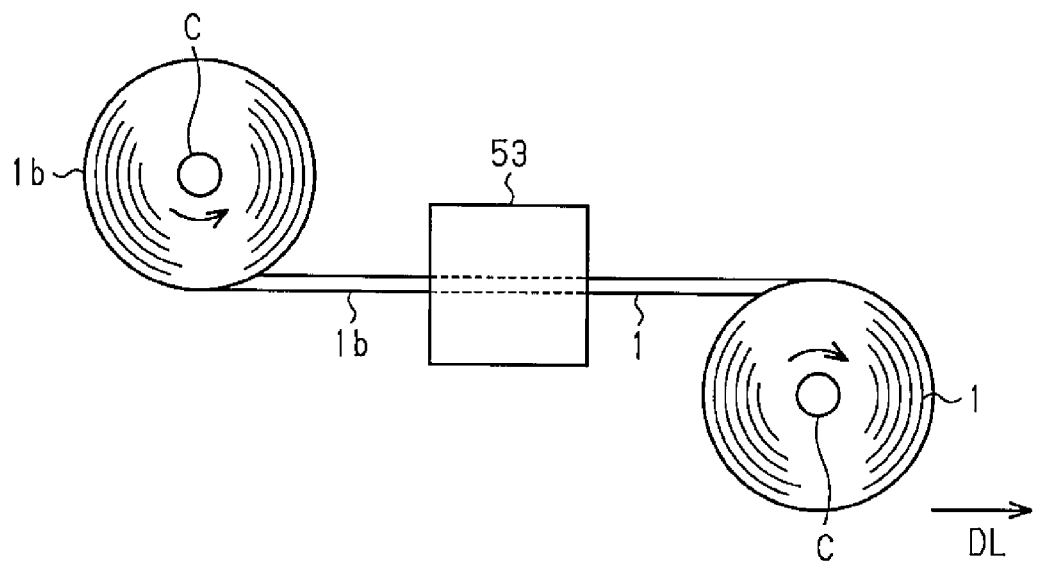
FIG. 13 is a process diagram showing a heating step for manufacturing the vapor deposition mask substrate.

FIGS. 12 and 13 show an example of a method for manufacturing a vapor deposition mask substrate using a rolling process.

Referring to FIG. 12, the method for manufacturing a vapor deposition mask substrate first prepares a base material 1a made of Invar, for example. The base material 1a extends in the longitudinal direction DL. Then, the base material 1a is transferred toward a rolling mill 50, which includes a pair of rolls 51 and 52, such that the longitudinal direction DL of the base material 1a is parallel to the direction in which the base material 1a is transferred. When the base material 1a reaches the pair of rolls 51 and 52, the rolls 51 and 52 roll the base material 1a. This stretches the base material 1a in the longitudinal direction DL, forming a rolled material 1b. The rolled material 1b is wound around a core C. However, the rolled material 1b may be handled in a state of being extended in the shape of a strip, instead of a state of being wound around the core C. The rolled material 1b has a thickness of between 10 μm and 50 μm inclusive, for example. The pressing force between the rolls 51 and 52 and the rotation speed of the rolls 51 and 52 are set to satisfy Conditions 1 to 3 described above.

As shown in FIG. 13, an annealing apparatus 53 is used to anneal the rolled material 1b and remove the residual stress remaining in the rolled material 1b. A vapor deposition mask substrate 1 is thus obtained. The annealing of the rolled material 1b is performed while extending the rolled material 1b in the longitudinal direction DL. This allows the vapor deposition mask substrate 1 to have a reduced residual stress as compared with the rolled material 1b before annealing. The rolling step and the annealing step may be modified as follows. For example, in the rolling step, the rolling mill may include a plurality of pairs of rolls. Further, the rolling step and the annealing step may be repeated to produce a vapor deposition mask substrate 1. Instead of annealing the rolled material 1b while extending it in the longitudinal direction DL, the rolled material 1b may be annealed while wound around the core C.

Nevertheless, when the annealing is performed on the rolled material 1b wound around the core C, the winding of the vapor deposition mask substrate 1 around the core C may result in the vapor deposition mask substrate 1 after annealing having the tendency for warpage according to the radius of the vapor deposition mask substrate 1 wound around the core C. Thus, depending on the radius of the vapor deposition mask substrate 1 wound around the core C and the material of the base material 1a, it may be preferable that the rolled material 1b be annealed while extended in the longitudinal direction DL.

When a vapor deposition mask substrate 1 is manufactured by a method using electrolysis, the vapor deposition mask substrate 1 is formed on the surface of the electrode for electrolysis and then removed from the surface. When the vapor deposition mask substrate 1 is made of Invar, the electrolytic bath for electrolysis contains an iron ion source, a nickel ion source, and a pH buffer, for example. The electrolytic bath used for electrolysis may also contain a stress relief agent, an $Fe^{3+}$ ion masking agent, and a complexing agent, such as malic acid and citric acid, and is a weakly acidic solution having a pH adjusted for electrolysis. Examples of the iron ion source include ferrous sulfate heptahydrate, ferrous chloride, and ferrous sulfamate. Examples of the nickel ion source include nickel (II) sulfate, nickel (II) chloride, nickel sulfamate, and nickel bromide. Examples of the pH buffer include boric acid and malonic acid. Malonic acid also functions as an $Fe^{3+}$ ion masking agent. The stress relief agent may be saccharin sodium, for example. The electrolytic bath used for electrolysis may be an aqueous solution containing additives listed above and is adjusted using a pH adjusting agent, such as 5% sulfuric acid or nickel carbonate, to have a pH of between 2 and 3 inclusive, for example.

The conditions for electrolysis are set so that the properties of the vapor deposition mask substrate 1, such as the thickness and composition ratio, are adjusted by the temperature of the electrolytic bath, current density, and electrolysis time. The electrolysis conditions of the process using the electrolytic bath include an anode, which may be pure iron and nickel. Further, the electrolysis conditions include a cathode, which may be a plate of stainless steel such as SUS304. The temperature of the electrolytic bath may be between 40° C. and 60° C. inclusive. The current density may be between 1 $A/dm^2$ and 4 $A/dm^2$ inclusive. The current density on the surface of an electrode is set to satisfy Conditions 1 to 3 described above.

The vapor deposition mask substrate 1 produced by electrolysis and the vapor deposition mask substrate 1 produced by rolling may be thinned by chemical or electrical polishing. The polishing solution used for chemical polishing may be a chemical polishing solution for an iron-based alloy that contains hydrogen peroxide as the main component. The electrolyte used for electrical polishing is a perchloric acid based electropolishing solution or a sulfuric acid based electropolishing solution. Since Conditions 1 to 3 described above are satisfied, the surface of the vapor deposition mask substrate 1 has limited variation in the result of polishing using the polishing solution and the result of cleaning of the polishing solution using a cleaning solution.

[Method for Manufacturing Mask Portion]

Referring to FIGS. 14 to 19, a process for manufacturing the mask portion 32 shown in FIG. 7 is now described. The process for manufacturing the mask portion 32 shown in FIG. 6 is the same as the process for manufacturing the mask portion 32 shown in FIG. 7 except that the small holes 32SH are formed as through-holes and the step of forming large holes 32LH is omitted. The overlapping steps are not described.

Figure 14:
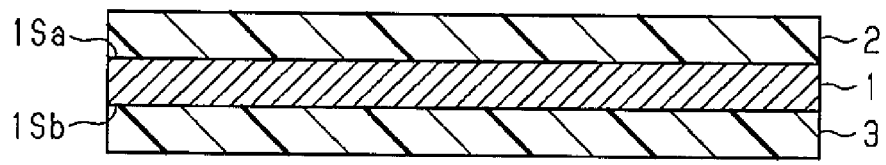
FIG. 14 is a process diagram showing an etching step for manufacturing a mask portion.

Referring to FIG. 14, manufacturing of a mask portion starts with preparation of a vapor deposition mask substrate 1 including a first surface 1Sa and a second surface 1Sb, a first dry film resist 2 to be affixed to the first surface 1Sa, and a second dry film resist 3 to be affixed to the second surface 1Sb. The two dry film resists 2 and 3 are films formed separately from the vapor deposition mask substrate 1. Then, the first dry film resist 2 is affixed to the first surface 1Sa, and the second dry film resist 3 is affixed to the second surface 1Sb.

Figure 15:
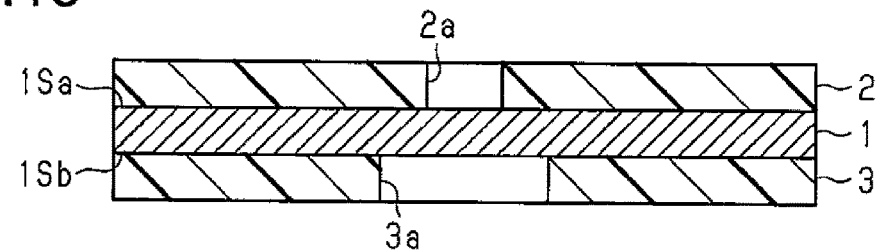
FIG. 15 is a process diagram showing an etching step for manufacturing the mask portion.

Referring to FIG. 15, the sections of the dry film resists 2 and 3 other than the sections in which holes are to be formed are exposed to light, and then the exposed dry film resists are developed. This forms first through-holes 2a in the first dry film resist 2 and second through-holes 3a in the second dry film resist 3. When exposing the first dry film resist 2 to light, an original plate is placed on the surface of the first dry film resist 2 that is opposite to the surface in contact with the vapor deposition mask substrate 1. The original plate is configured to allow the light to reach the sections other than the sections in which first through-holes 2a are to be formed. When exposing the second dry film resist 3 to light, an original plate is placed on the surface of the second dry film resist 3 that is opposite to the surface in contact with the vapor deposition mask substrate 1. The original plate is configured to allow the light to reach the sections other than the sections in which second through-holes 3a are to be formed. The development of the exposed dry film resists uses sodium carbonate solution, for example, as the developing solution. Since Conditions 1 to 3 described above are satisfied, the surface of the vapor deposition mask substrate 1 has limited variation in the result of development using the developing solution and the result of cleaning using a cleaning solution. This increases the consistency of the shape and size of the first and second through-holes 2a and 3a in the surface of the vapor deposition mask substrate 1.

Figure 16:
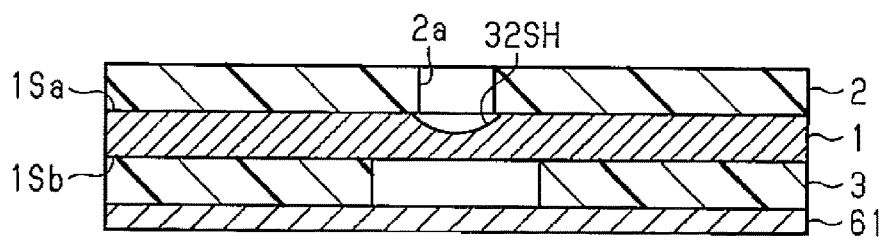
FIG. 16 is a process diagram showing an etching step for manufacturing the mask portion.

As shown in FIG. 16, the first surface 1Sa of the vapor deposition mask substrate 1 may be etched with ferric chloride solution using the first dry film resist 2 as the mask. Here, a second protection layer 61 is formed on the second dry film resist 3 so that the second surface 1Sb of the vapor deposition mask substrate 1 is not etched together with the first surface 1Sa. The second protection layer 61 may be made of any material that resists etching with the ferric chloride solution. Small holes 32SH extending toward the second surface 1Sb are thus formed in the first surface 1Sa of the vapor deposition mask substrate 1 through the first through-holes 2a of the first dry film resist 2. Each small hole 32SH includes a first opening H1, which opens in the first surface 1Sa. Since Conditions 1 to 3 described above are satisfied, the surface of the vapor deposition mask substrate 1 has limited variation in the result of etching using an etchant and the result of cleaning using a cleaning solution. This increases the consistency of the shape and size of the small holes 32SH in the surface of the vapor deposition mask substrate 1.

The etchant for etching the vapor deposition mask substrate 1 may be an acidic etchant. When the vapor deposition mask substrate 1 is made of Invar, any etchant that is capable of etching Invar may be used. The acidic etchant may be a solution containing perchloric acid, hydrochloric acid, sulfuric acid, formic acid, or acetic acid mixed in a ferric perchlorate solution or a mixture of a ferric perchlorate solution and a ferric chloride solution. The vapor deposition mask substrate 1 may be etched by a dipping method that immerses the vapor deposition mask substrate 1 in an acidic etchant, or by a spraying method that sprays an acidic etchant onto the vapor deposition mask substrate 1.

Figure 17:
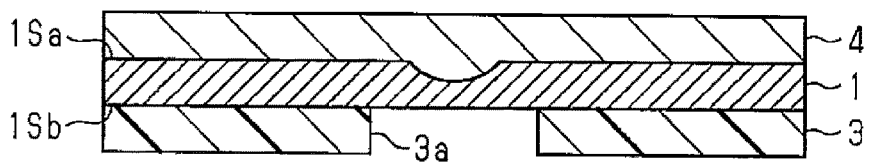
FIG. 17 is a process diagram showing an etching step for manufacturing the mask portion.

As shown in FIG. 17, the first dry film resist 2 formed on the first surface 1Sa of the vapor deposition mask substrate 1 and the second protection layer 61 on the second dry film resist 3 are removed. In addition, a first protection layer 4 is formed on the first surface 1Sa of the vapor deposition mask substrate 1 to prevent etching of the first surface 1Sa. The first protection layer 4 may be made of any material that resists etching with the ferric chloride solution.

Figure 18:
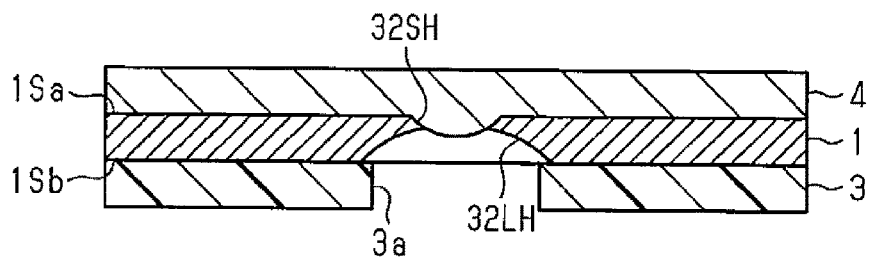
FIG. 18 is a process diagram showing an etching step for manufacturing the mask portion.

As shown in FIG. 18, the second surface 1Sb of the vapor deposition mask substrate 1 is etched with ferric chloride solution using the second dry film resist 3 as the mask. Large holes 32LH extending toward the first surface 1Sa are thus formed in the second surface 1Sb of the vapor deposition mask substrate 1 through the second through-holes 3a of the second dry film resist 3. Each large hole 32LH has a second opening H2, which opens in the second surface 1Sb. The second openings H2 are larger than the first openings H1 in a plan view of the second surface 1Sb. Since Conditions 1 to 3 described above are satisfied, the surface of the vapor deposition mask substrate 1 has limited variation in the result of etching using an etchant and the result of cleaning of the etchant using a cleaning solution. This increases the consistency of the shape and size of the large holes 32LH in the surface of the vapor deposition mask substrate 1. The etchant used in this step may also be an acidic etchant. When the vapor deposition mask substrate 1 is made of Invar, any etchant that is capable of etching Invar may be used. The vapor deposition mask substrate 1 may also be etched by a dipping method that immerses the vapor deposition mask substrate 1 in an acidic etchant, or by a spraying method that sprays an acidic etchant onto the vapor deposition mask substrate 1.

Figure 19:
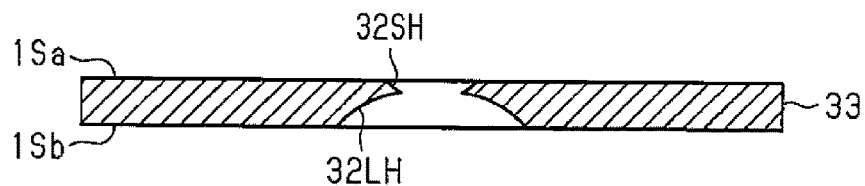
FIG. 19 is a process diagram showing an etching step for manufacturing the mask portion.

As shown in FIG. 19, removing the first protection layer 4 and the second dry film resist 3 from the vapor deposition mask substrate 1 completes the mask portion 32 having a plurality of small holes 32SH and large holes 32LH connected to the small holes 32SH.

When forming the base material 1a to be rolled to form the vapor deposition mask substrate 1, a deoxidizer, such as granular aluminum or magnesium, is typically mixed into the material for forming the base material so as to remove the oxygen trapped in the material for forming the base material to be rolled. The aluminum and magnesium are mixed into the base material as a metallic oxide such as an aluminum oxide and a magnesium oxide. While most of the metallic oxide is removed from the base material before the base material is rolled, some of the metallic oxide remains in the base material to be rolled. In this respect, the method for manufacturing the vapor deposition mask substrate 1 using electrolysis limits mixing of the metallic oxide into the mask portion 32.

[Method for Manufacturing Vapor Deposition Mask]

Various examples of a method for manufacturing a vapor deposition mask are now described. Referring to FIGS. 20A to 20H, an example of a method for forming holes by wet etching is described. Further, an example of a method for forming holes by electrolysis is described referring to FIGS. 21A to 21E, and another example of a method for forming holes by electrolysis is described referring to FIGS. 22A to 22F. The method for manufacturing a vapor deposition mask including the mask portion 32 described with reference to FIG. 6 and the method for manufacturing a vapor deposition mask including the mask portion 32 described with reference to FIG. 7 involve substantially identical processes except for the step of etching a substrate 32K. The following description mainly focuses on the method for manufacturing a vapor deposition mask including the mask portion 32 shown in FIG. 6. The overlapping steps in the method for manufacturing a vapor deposition mask including the mask portion 32 shown in FIG. 7 are not described.

In the example of a method for manufacturing a vapor deposition mask shown in FIGS. 20A to 20H, a substrate 32K is first prepared (FIG. 20A). The substrate 32K includes the vapor deposition mask substrate 1 described above, which is to be processed as a mask plate 323. In addition, the substrate 32K preferably includes a support SP, which supports the vapor deposition mask substrate 1. The first surface 321 of the substrate 32K corresponds to the first surface 1Sa described above, and the second surface 322 of the substrate 32K corresponds to the second surface 1Sb described above.

A resist layer PR is formed on the second surface 322 of the prepared substrate 32K (FIG. 20B), and the resist layer PR undergoes exposure and development so that a resist mask RM is formed on the second surface 322 (FIG. 20C). Holes 32H are then formed in the substrate 32K by wet etching from the second surface 322 using the resist mask RM (FIG. 20D). In this step, second openings H2 are formed in the second surface 322, where the wet etching starts, and first openings H1 smaller than the second openings H2 are formed in the first surface 321, which is subjected to the wet etching after the second surface 322. The resist mask RM is then removed from the second surface 322, leaving the mask portion 32 described above (FIG. 20E). Finally, the outer edge sections 32E of the second surface 322 are joined to the inner edge sections 31E of a frame portion 31, and the support SP is removed from the mask portion 32 to complete the vapor deposition mask 30 (FIGS. 20F to 20H).

In the method for manufacturing a vapor deposition mask including the mask portion 32 shown in FIG. 7, the steps described above are performed on the surface of a substrate 32K corresponding to the first surface 321 to form small holes 32SH. This substrate 32K does not include a support SP. The small holes 32SH are then filled with a material for protecting the small holes 32SH, such as a resist. Then, the steps described above are performed on the surface of the substrate 32K corresponding to the second surface 322, thereby forming a mask portion 32.

The example shown in FIG. 20F uses resistance welding to join the outer edge sections 32E of the second surface 322 to the inner edge sections 31E of the frame portion 31. This method forms a plurality of holes SPH in an insulative support SP. The holes SPH are formed in the sections of the support SP that face the sections that become joining sections 32BN. Then, with stress acting on the mask portion 32 outward of the mask portion 32, the joining sections 32BN are formed separately by energization through the holes SPH. This welds the outer edge sections 32E to the inner edge sections 31E.

The example shown in FIG. 20G uses laser welding to join the outer edge sections 32E of the second surface 322 to the inner edge sections 31E of the frame portion 31. This method uses a light transmitting support SP and irradiates the sections that become joining sections 32BN with laser light through the support SP. Separate joining sections 32BN are formed by intermittently applying laser light, or a continuous joining section 32BN is formed by continuously applying laser light. The outer edge sections 32E are thus welded to the inner edge sections 31E. When the support SP supports the mask portion 32 with stress acting on the mask portion 32 outward of the mask portion 32, this welding process does not have to involve application of additional stress to the mask portion 32.

The example shown in FIG. 20H uses ultrasonic welding to join the outer edge sections 32E of the second surface 322 to the inner edge sections 31E of the frame portion 31. This method applies ultrasonic waves to the sections that become joining sections 32BN with the outer edge sections 32E and the inner edge sections 31E held together by clamps CP or other device. The member to which ultrasonic waves are directly applied may be the frame portion 31 or the mask portion 32. The method using ultrasonic welding leaves crimp marks of the clamps CP in the frame portion 31 and the support SP.

The vapor deposition masks described with reference to FIGS. 8 and 9 may be manufactured by another example shown in FIGS. 21A to 21E and another example shown in FIGS. 22A to 22F.

Figure 21A:
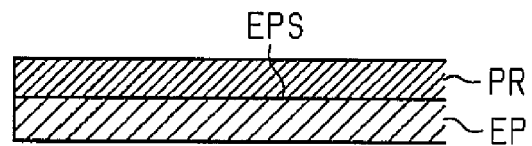
Figure 21B:
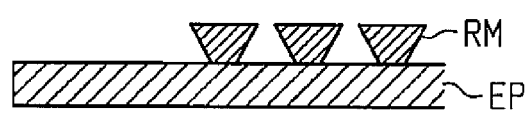
Figure 21C:
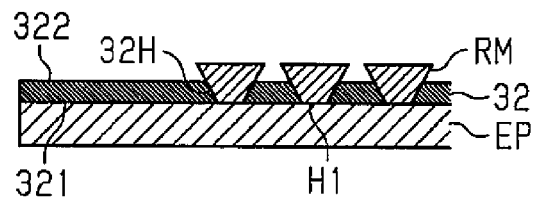

In another example of a method for manufacturing a vapor deposition mask shown in FIGS. 21A to 21E, a resist layer PR is first formed on an electrode surface EPS, which is a surface of an electrode EP used for electrolysis (see FIG. 21A). Then, the resist layer PR undergoes exposure and development so that a resist mask RM, which is an example of a pattern, is formed on the electrode surface EPS (FIG. 21B). The resist mask RM includes the shape of a reverse truncated cone with the apex located on the electrode surface EPS in a cross-section perpendicular to the electrode surface EPS. The cross-sectional area of each shape along the electrode surface EPS increases away from the electrode surface EPS. Then, electrolysis is performed using the electrode surface EPS having the resist mask RM, and a metal sheet extending over the region on the electrode surface EPS other than the resist mask RM is formed as a mask portion 32 (FIG. 21C).

In this step, the metal sheet is formed of the metal deposited in the space that is not occupied by the resist mask RM. Accordingly, the metal sheet includes holes shaped corresponding to the shape of the resist mask RM. Self-aligned holes 32H are thus formed in the mask portion 32. The surface in contact with the electrode surface EPS functions as the first surface 321 having the first openings H1, and the outermost surface having second openings H2, which are larger than the first openings H1, functions as the second surface 322.

Figure 21D:
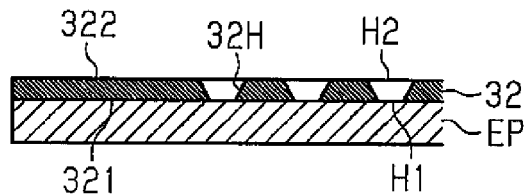
Figure 21E:
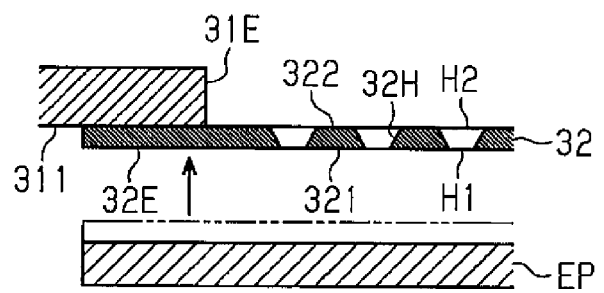

Then, only the resist mask RM is removed from the electrode surface EPS, leaving holes 32H, which are hollows extending from the first openings H1 to the second openings H2 (FIG. 21D). Finally, the joining surface 311 of the inner edge section 31E is joined to the outer edge section 32E of the second surface 322 including second openings H2, and then stress is applied to the frame portion 31 to peel off the mask portion 32 from the electrode surface EPS. Alternatively, the mask portion 32 may be joined to a support, and the joining surface 311 of the inner edge section 31E is joined to the outer edge section 32E of the second surface 322 of the mask portion 32 after the mask portion 32 is peeled off from the electrode surface EPS. The vapor deposition mask 30 in which the mask portion 32 is joined to the frame portion 31 is thus manufactured (FIG. 21E).

Figure 22A:
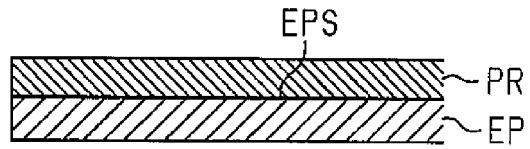
FIGS. 22A to 22F are process diagrams for illustrating an example of a method for manufacturing a vapor deposition mask.
Figure 22B:
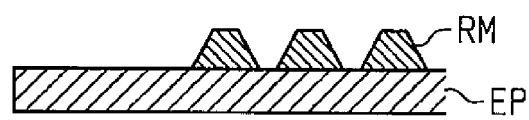
Figure 22C:
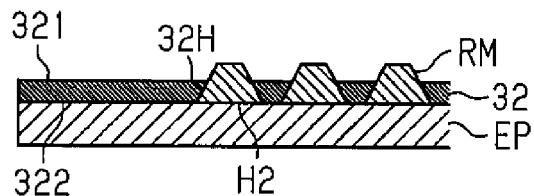

In another example of a method for manufacturing a vapor deposition mask shown in FIGS. 22A to 22F, a resist layer PR is first formed on an electrode surface EPS used for electrolysis (see FIG. 22A). Then, the resist layer PR undergoes exposure and development so that a resist mask RM, which is an example of a pattern, is formed on the electrode surface EPS (FIG. 22B). The resist mask RM includes the shape of a truncated cone with the substrate located on the electrode surface EPS in a cross-section perpendicular to the electrode surface EPS. The cross-sectional area of each shape along the electrode surface EPS decreases away from the electrode surface EPS. Then, electrolysis is performed using the electrode surface EPS having the resist mask RM, and a metal sheet extending over the region on the electrode surface EPS other than the resist mask RM is formed as a mask portion 32 (FIG. 22C).

As with the method described above, the metal sheet is formed of the metal deposited in the space that is not occupied by the resist mask RM. This forms in the metal sheet holes shaped corresponding to the shape of the resist mask RM. Self-aligned holes 32H are thus formed in the mask portion 32. The surface in contact with the electrode surface EPS functions as the second surface 322 having the second openings H2, and the outermost surface having the first openings H1, which are smaller than the second openings H2, functions as the first surface 321.

Figure 22D:
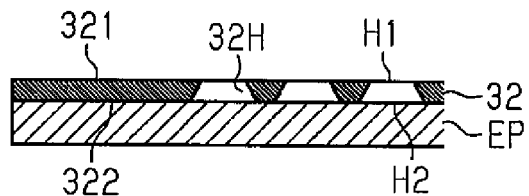
Figure 22E:
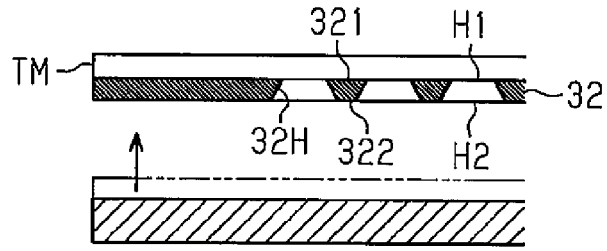
Figure 22F:
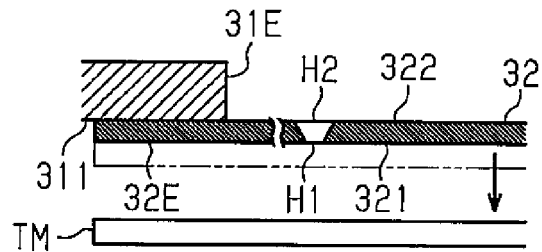

Then, only the resist mask RM is removed from the electrode surface EPS, leaving holes 32H, which are hollows extending from the first openings H1 to the second openings H2 (FIG. 22D). An intermediate transfer substrate TM is joined to the first surface 321 including the first openings H1, and stress is then applied to the intermediate transfer substrate TM to peel off the mask portion 32 from the electrode surface EPS. This separates the second surface 322 from the electrode surface EPS with the mask portion 32 joined to the intermediate transfer substrate TM (FIG. 22E). Finally, the joining surface 311 of the inner edge section 31E is joined to the outer edge section 32E of the second surface 322 having the second openings H2, and then the intermediate transfer substrate TM is peeled off from the mask portion 32. The vapor deposition mask 30 in which the mask portion 32 is joined to the frame portion 31 is thus manufactured (FIG. 22F).

EXAMPLES

Referring to FIGS. 23 to 29, Examples are now described.

Example 1

Figure 23:
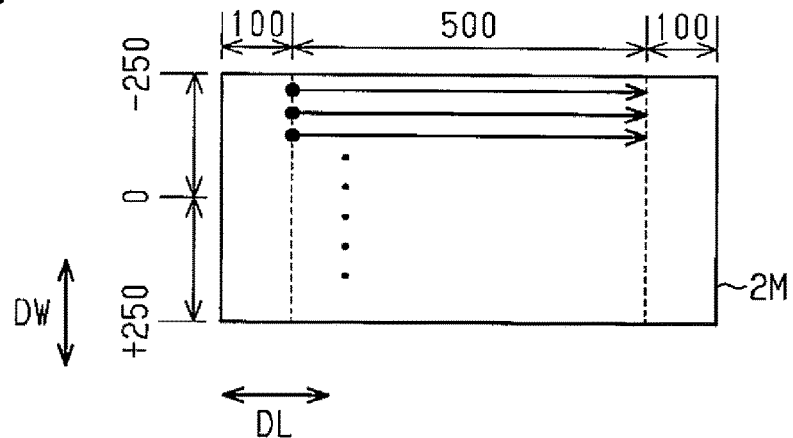
FIG. 23 is a plan view showing the planar structure of a measurement substrate of an example together with dimensions.

A base material $1a$, which is made of Invar, was subjected to a rolling step and a slitting step of cutting the rolled metal sheet into sections of the desired dimension in the width direction DW. A rolled material $1b$ thus formed was annealed to form a vapor deposition mask substrate 1 of Example 1, which had a length in the width direction DW of 500 mm and a thickness of 20 μm. As shown in FIG. 23, a measurement substrate 2M of Example 1 was cut out from the vapor deposition mask substrate 1 of Example 1. The measurement substrate 2M had a length in the longitudinal direction DL of 700 mm. Surface distances L of the obtained measurement substrate 2M were measured over the entire range in the width direction DW of the measurement substrate 2M to determine elongation difference ratios of the measurement substrate 2M of Example 1. The measurement conditions of surface distances L were as follows.

Measurement device: CNC image measurement system VMR-6555 manufactured by Nikon Corporation Length in the longitudinal direction DL of measurement area ZL: 500 mm Length in the longitudinal direction DL of non-measurement area ZE: 100 mm Measurement interval in the longitudinal direction DL: 1 mm Measurement interval in the width direction DW: 20 mm FIG. 24 and Table 1 show the measurement result of the elongation difference ratios of Example 1. Table 1 shows the maximum values of the elongation difference ratios in the center section RC and edge sections RE.

Figure 24:
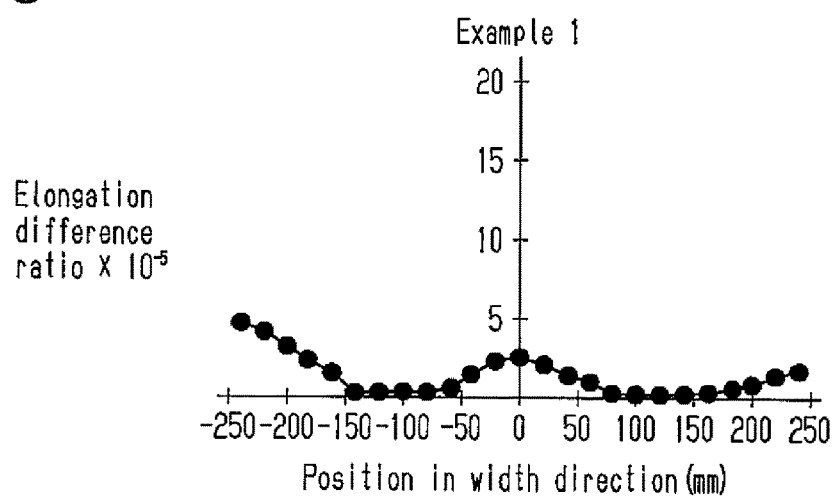
FIG. 24 is a graph showing elongation difference ratios of Example 1.

As shown in FIG. 24, the maximum value of the elongation difference ratios in the center section RC of Example 1 was less than or equal to $2.42\times10^{-5}$, and the elongation difference ratios in the edge sections RE were less than or equal to $10\times10^{-5}$, indicating that Example 1 satisfied Conditions 2 and 3 described above. In Example 1, the maximum value of the elongation difference ratios in one of the two edge sections RE in the width direction DW (the edge section A) was $4.56\times10^{-5}$ and greater than the elongation difference ratios in the center section RC, and the maximum value of the elongation difference ratios in the other edge section RE in the width direction DW (the edge section B) was $1.53\times10^{-5}$ and less than the elongation difference ratios in the center section RC in the width direction DW. That is, Condition 1 described above was satisfied. The difference between the maximum values of the elongation difference ratios in the edge sections RE in the width direction DW was $3.03\times10^{-5}$.

Example 2

A vapor deposition mask substrate 1 of Example 2 having a length in the width direction DW of 500 mm and a thickness of 15 μm was obtained under the same conditions as Example 1 except that the pressing force between the rolls 51 and 52 was higher than that in Example 1. A measurement substrate 2M was cut out from the vapor deposition mask substrate 1 of Example 2 in the same manner as Example 1, and surface distances L of the obtained measurement substrate 2M were measured over the entire range in the width direction DW of the measurement substrate 2M to determine elongation difference ratios of the measurement substrate 2M of Example 2.

Figure 25:
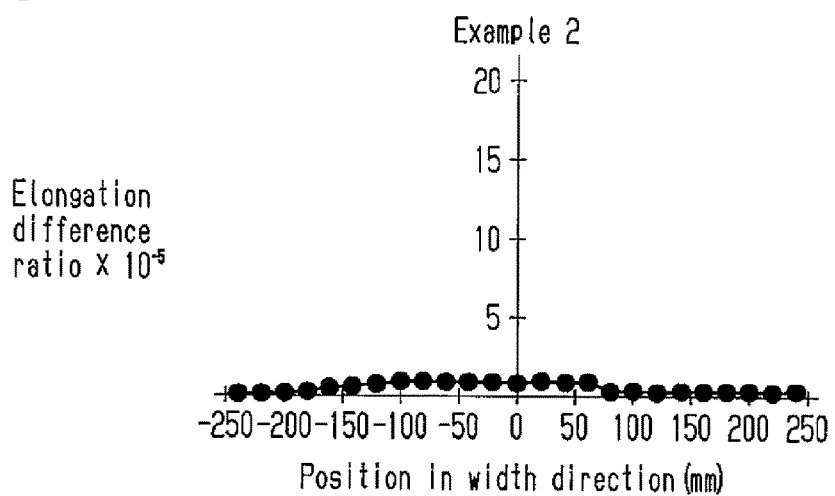
FIG. 25 is a graph showing elongation difference ratios of Example 2.

FIG. 25 and Table 1 show the measurement result of elongation difference ratios of Example 2.

As shown in FIG. 25, the maximum value of the elongation difference ratios in the center section RC of Example 2 was $0.75\times10^{-5}$, and the maximum values of the elongation difference ratios in the edge sections RE were $0.10\times10^{-5}$ and $0.68\times10^{-5}$. In Example 2, the elongation difference ratios in both of the edge sections RE in the width direction DW were less than the elongation difference ratios in the center section RC of the width direction DW, indicating that Example 2 satisfied Conditions 1 to 3.

Example 3

A vapor deposition mask substrate 1 of Example 3 having a length in the width direction DW of 500 mm and a thickness of 15 μm was obtained under the same conditions as Example 1 except that the pressing force between the rolls 51 and 52 was higher than that in Example 1 and distributed in a manner different from that in Example 2. A measurement substrate 2M was cut out from the vapor deposition mask substrate 1 of Example 3 in the same manner as Example 1, and surface distances L of the obtained measurement substrate 2M were measured over the entire range in the width direction DW of the measurement substrate 2M to determine elongation difference ratios of the measurement substrate 2M of Example 3.

Figure 26:
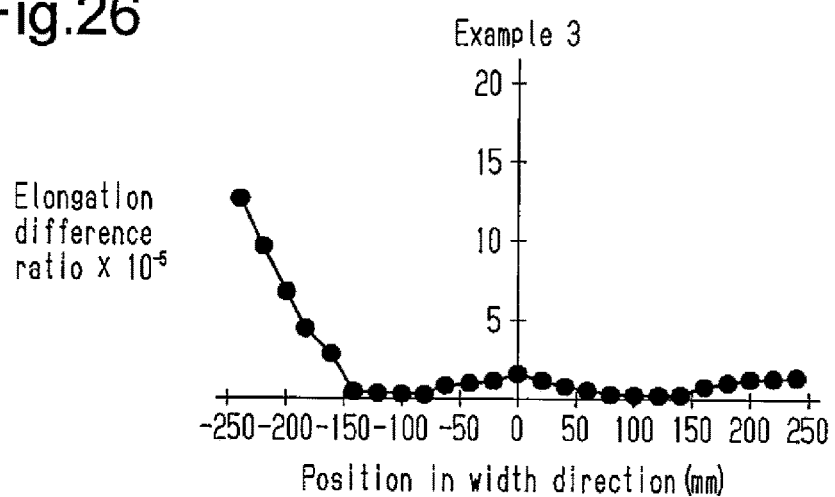
FIG. 26 is a graph showing elongation difference ratios of Example 3.

FIG. 26 and Table 1 show the measurement result of elongation difference ratios of Example 3.

As shown in FIG. 26, the maximum value of the elongation difference ratios in the center section RC of Example 3 was less than or equal to $1.23 \times 10^{-5}$, and the elongation difference ratios in the edge sections RE were less than or equal to $15 \times 10^{-5}$, indicating that Example 3 satisfied Conditions 2 and 3. In Example 3, the maximum value of the elongation difference ratios in one of the two edge sections RE in the width direction DW (the edge section B) was $1.11 \times 10^{-5}$ and less than the elongation difference ratios in the center section RC, and the maximum value of the elongation difference ratios in the other edge section RE in the width direction DW (the edge section A) was $12.50 \times 10^{-5}$ and greater than the elongation difference ratios in the center section RC. That is, Condition 1 described above was satisfied. The difference between the maximum values of the elongation difference ratios in the edge sections RE in the width direction DW was $11.39 \times 10^{-5}$.

Comparison Example 1

A vapor deposition mask substrate 1 of Comparison Example 1 having a length in the width direction DW of 500 mm and a thickness of 20 μm was obtained under the same conditions as Example 1 except that the pressing force between the rolls 51 and 52 and the rotation speed of the rolls 51 and 52 were greater than those in Example 1. A measurement substrate 2M was cut out from the vapor deposition mask substrate 1 of Comparison Example 1 in the same manner as Example 1, and surface distances L of the obtained measurement substrate 2M were measured over the entire range in the width direction DW of the measurement substrate 2M to determine elongation difference ratios of the measurement substrate 2M of Comparison Example 1.

Figure 27:
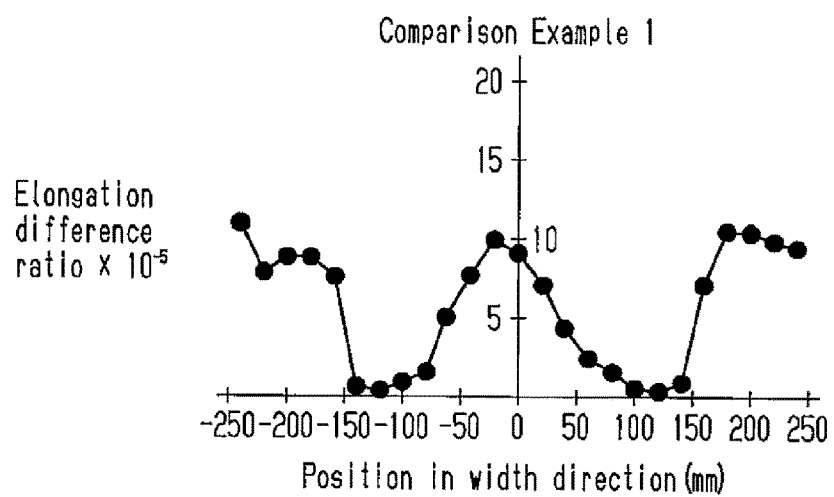
FIG. 27 is a graph showing elongation difference ratios of Comparison Example 1.

FIG. 27 and Table 1 show the measurement result of elongation difference ratios of Comparison Example 1.

As shown in FIG. 27, the maximum value of the elongation difference ratios in the center section RC of Comparison Example 1 was $9.68 \times 10^{-5}$, and the elongation difference ratios in the edge sections RE were less than or equal to $15 \times 10^{-5}$, indicating that Comparison Example 1 failed to satisfy Condition 2. In Comparison Example 1, elongation difference ratios in both of the edge sections RE in the width direction DW were greater than the elongation difference ratios in the center section RC of the width direction DW, indicating that Comparison Example 1 also failed to satisfy Condition 1.

Comparison Example 2

A vapor deposition mask substrate 1 of Comparison Example 2 having a length in the width direction DW of 500 mm and a thickness of 20 μm was obtained under the same conditions as Comparison Example 1 except that the pressing force between the rolls 51 and 52 was distributed in a manner different from that in Comparison Example 1. A measurement substrate 2M was cut out from the vapor deposition mask substrate 1 of Comparison Example 2 in the same manner as Comparison Example 1, and surface distances L of the obtained measurement substrate 2M were measured over the entire range in the width direction DW of the measurement substrate 2M to determine elongation difference ratios of the measurement substrate 2M of Comparison Example 2.

Figure 28:
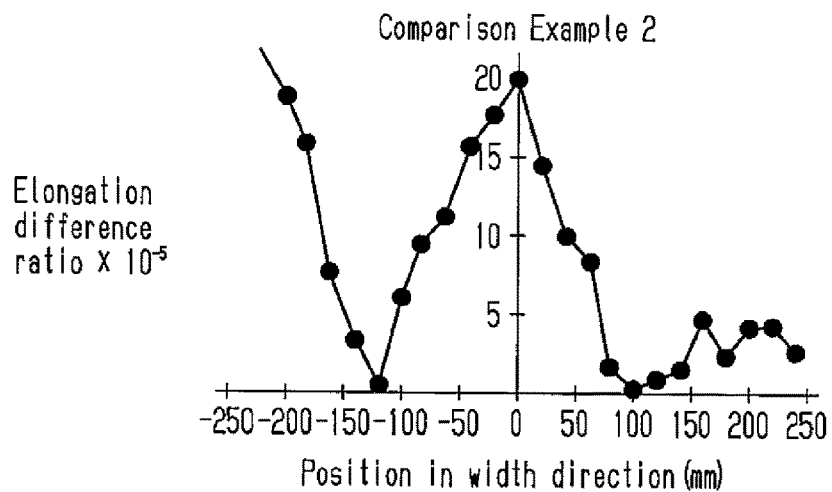
FIG. 28 is a graph showing elongation difference ratios of Comparison Example 2.

FIG. 28 and Table 1 show the measurement result of elongation difference ratios of Comparison Example 2.

As shown in FIG. 28, the maximum value of the elongation difference ratios in the center section RC of Comparison Example 2 was $19.66 \times 10^{-5}$, and the elongation difference ratios in one of the edge sections RE (the edge section A) were greater than or equal to $15 \times 10^{-5}$, indicating that Comparison Example 2 failed to satisfy Conditions 2 and 3. In Comparison Example 2, the maximum value of the elongation difference ratios in one of the two edge sections RE in the width direction DW (the edge section B) was $4.48 \times 10^{-5}$ and less than the elongation difference ratios in the center section RC, and the maximum value of the elongation difference ratios in the other edge section RE in the width direction DW (the edge section A) was $26.54 \times 10^{-5}$ and greater than the elongation difference ratios in the center section RC. That is, Condition 1 was satisfied.

Comparison Example 3

A vapor deposition mask substrate 1 of Comparison Example 3 having a length in the width direction DW of 500 mm and a thickness of 20 μm was obtained under the same conditions as Comparison Example 1 except that the pressing force between the rolls 51 and 52 was distributed in a manner different from that in Comparison Example 1. A measurement substrate 2M was cut out from the vapor deposition mask substrate 1 of Comparison Example 3 in the same manner as Comparison Example 1, and surface distances L of the obtained measurement substrate 2M were measured over the entire range in the width direction DW of the measurement substrate 2M to determine elongation difference ratios of the measurement substrate 2M of Comparison Example 3.

Figure 29:
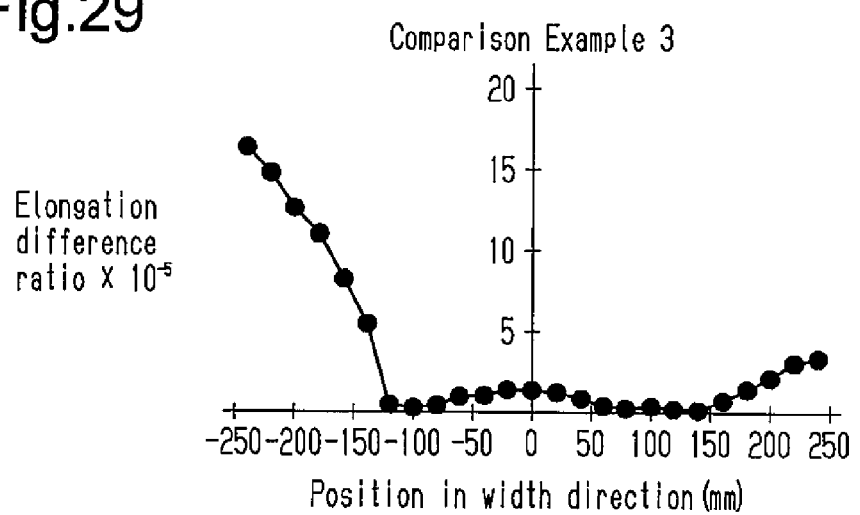
FIG. 29 is a graph showing elongation difference ratios of Comparison Example 3.

FIG. 29 and Table 1 show the measurement result of elongation difference ratios of Comparison Example 3.

As shown in FIG. 29, the maximum value of the elongation difference ratios in the center section RC of Comparison Example 3 was $1.19 \times 10^{-5}$. In Comparison Example 3, the maximum value of the elongation difference ratios in one of the two edge sections RE in the width direction DW (the edge section B) was $3.24 \times 10^{-5}$ and greater than the elongation difference ratios in the center section RC, and the maximum value of the elongation difference ratios in the other edge section RE in the width direction DW (the edge section A) was $16.10 \times 10^{-5}$ and greater than the elongation difference ratios in the center section RC. That is, Comparison Example 3 satisfied Condition 2 but failed to satisfy Conditions 1 and 3.

TABLE 1

| | | Elongation Difference Ratio | | | Variation in Size of |
|---|---|---|---|---|---|
| Item | Thickness | Edge Section A | Center Section ×10⁻⁵ | Edge Section B | Openings in Pattern |
| Example 1 | 20 μm | 4.56 | 2.42 | 1.53 | ○ |
| Example 2 | 15 μm | 0.68 | 0.75 | 0.10 | ○ |
| Example 3 | 15 μm | 12.50 | 1.23 | 1.11 | ○ |
| Comparison Example 1 | 20 μm | 10.68 | 9.68 | 10.24 | X |
| Comparison Example 2 | 20 μm | 26.54 | 19.66 | 4.48 | X |
| Comparison Example 3 | 20 μm | 16.10 | 1.19 | 3.24 | X |

[Pattern Accuracy]

A first dry film resist 2 having a thickness of 10 μm was affixed to the first surface 1Sa of the vapor deposition mask substrate 1 of each of Examples 1 to 3 and Comparison Examples 1 to 3. Each first dry film resist 2 underwent an exposure step, in which the first dry film resist 2 was exposed to light while in contact with an exposure mask, and a development step. This formed through-holes 2a having a diameter of 30 μm in the first dry film resist 2 in a grid pattern. Then, the first surface 1Sa was etched using the first dry film resist 2 as the mask so that holes 32H were formed in the vapor deposition mask substrate 1 in a grid pattern. The diameter of the opening of each hole 32H was measured in the width direction DW of the vapor deposition mask substrate 1. Table 1 shows the variations in diameter of the openings of the holes 32H in the width direction DW. In Table 1, the levels in which the difference between the maximum value and the minimum value of opening diameters of the holes 32H is less than or equal to 2.0 μm are marked with "○", and the levels in which the difference between the maximum value and the minimum value of opening diameters is greater than 2.0 μm are marked with "x".

As shown in Table 1, the variations in diameter of the openings of Examples 1 to 3 were less than or equal to 2.0 μm. In contrast, the variations in diameter of the openings of Comparison Examples 1 to 3 were greater than 2.0 μm.

In Comparison Example 1, elongation difference ratios in both of the edge sections RE were greater than the elongation difference ratios in the center section RC, and the elongation difference ratios in the center section RC were $9.68 \times 10^{-5}$ and greater than $3 \times 10^{-5}$. Comparison Example 1 failed to satisfy Conditions 1 and 2. Although Comparison Example 1 satisfied Condition 3, the significant unevenness in the surface resulting from the excessive elongation difference ratios along the width direction DW caused the variation in diameter of the openings.

In each of Examples 1 and 3 and Comparison Example 2, the elongation difference ratios in one of the edge sections RE were less than the elongation difference ratios in the center section RC, and Condition 1 was satisfied. However, while the elongation difference ratios in the center sections RC of Examples 1 and 3 were less than or equal to $3.0 \times 10^{-5}$, the elongation difference ratios in the center section RC of Comparison Example 2 exceeded $3.0 \times 10^{-5}$, failing to satisfy Condition 2. Additionally, the elongation difference ratios in both edge sections RE were less than or equal to $15 \times 10^{-5}$ in Examples 1 and 2, whereas the elongation difference ratios in one of the edge sections RE of Comparison Example 3 were not less than or equal to $15 \times 10^{-5}$, failing to satisfy Condition 3. Furthermore, while the variations in diameter of the openings in Examples 1 and 2 were less than or equal to 2.0 μm, the variation in diameter of the opening in Comparison Example 2 was greater than 2.0 μm.

The comparison between Examples 1 and 3 and Comparison Example 2 shows that a structure in which the elongation difference ratios in the center section RC are less than or equal to $3 \times 10^{-5}$ and the elongation difference ratios in the edge sections RE are less than or equal to $15 \times 10^{-5}$, that is, a structure that satisfies Conditions 2 and 3, limits variation in diameter of openings. In other words, even if a vapor deposition mask substrate 1 satisfies the condition that the elongation difference ratios in one of the edge sections RE are less than the elongation difference ratios in the center section RC, failure to satisfy Conditions 2 and 3 leads to variation in diameter of the openings due to the unevenness caused by the excessive elongation difference ratios.

The elongation difference ratios in the center section RC in each of Examples 1 and 3 and Comparison Example 3 were less than or equal to $3 \times 10^{-5}$, satisfying Condition 2. However, while Examples 1 and 3 each satisfied Condition 1 since the elongation difference ratios in one of the edge sections RE were less than the elongation difference ratio in the center section RC, Comparison Example 3 failed to satisfy Condition 1 since the elongation difference ratios in the edge sections RE were greater than the elongation difference ratios in the center section RC. Additionally, while Examples 1 and 2 each satisfied Condition 3 since the elongation difference ratios in both of the edge sections RE were less than or equal to $15 \times 10^{-5}$, Comparison Example 3 failed to satisfy Condition 3 since the elongation difference ratios in one of the edge sections RE are not less than or equal to $15 \times 10^{-5}$. Furthermore, the variations in diameter of the openings in Examples 1 and 2 were less than or equal to 2.0 μm, whereas the variation in diameter of the openings in Comparison Example 3 was greater than 2.0 μm.

The comparison between Examples 1 and 2 and Comparison Example 3 shows that the failure to satisfy Condition 3 leads to the variation in diameter of the openings. That is, with a vapor deposition mask substrate in which the elongation difference ratios in the center section RC are less than the elongation difference ratios in both of the edge sections RE, any pools of liquid in the center section RC or other factors cause the variation in diameter of the openings, even if the elongation difference ratios in one of the edge sections RE are significantly greater than the elongation difference ratios in the other edge section RE.

The above-described embodiment achieves the following advantages.

(1) The increased accuracy of the shape and size of the holes in the mask portion 32 increases the accuracy of the pattern formed by vapor deposition. The method for exposing the resist is not limited to a method of bringing the exposure mask into contact with the resist. The exposure may be performed without bringing the resist into contact with the exposure mask. Bringing the resist into contact with the exposure mask presses the vapor deposition mask substrate onto the surface of the exposure mask. This limits reduction in the accuracy of exposure, which would otherwise occur due to the undulated shape of the vapor deposition mask substrate. The accuracy in the step of processing the surface with liquid is increased regardless of the exposure method, thereby increasing the accuracy of the pattern formed by vapor deposition.

(2) The surface of the vapor deposition mask substrate 1 has limited variation in the result of development using a developing solution and the result of cleaning using a cleaning solution. This increases the consistency of the shape and size of the first and second through-holes 2a and 3a, which are formed by the exposure step and the development step, in the surface of the vapor deposition mask substrate 1.

(3) The surface of the vapor deposition mask substrate 1 has limited variation in the result of etching using an etchant and the result of cleaning of the etchant using a cleaning solution. The surface of the vapor deposition mask substrate 1 has limited variation in the result of stripping of the resist layer using a stripping solution and the result of cleaning of the stripping solution using a cleaning solution. This increases the consistency of the shape and size of the small holes 32SH and the large holes 32LH in the surface of the vapor deposition mask substrate 1.

(4) The total quantity of holes 32H required in one frame portion 31 is divided into three mask portions 32. That is, the total area of the mask portions 32 required in one frame portion 31 is divided into three mask portions 32, for example. Thus, any partial deformation of a mask portion 32 in a frame portion 31 does not require replacement of all mask portions 32 in the frame portion 31. As compared with a structure in which one frame portion 31 includes only one mask portion 32, the size of a new mask portion 32 for replacing the deformed mask portion 32 may be reduced to about one-third.

(5) The surface distances L are measured using the measurement substrate 2M with the non-measurement areas ZE, which are the two end sections in the longitudinal direction DL of the measurement substrate 2M, excluded from the measurement target of surface distances L. Each non-measurement area ZE is the area that can have an undulated shape that is different from that of the vapor deposition mask substrate 1 and formed when the vapor deposition mask substrate 1 is cut. As such, excluding the non-measurement areas ZE from the measurement target will increase the accuracy of measurement of the surface distances L.

DESCRIPTION OF THE REFERENCE NUMERALS

C . . . Core; F . . . Stress; L . . . Surface Distance; S . . . Vapor Deposition Target; V . . . Space; W . . . Dimension; CP . . . Clamp; DL . . . Longitudinal Direction; DW . . . Width Direction; EP . . . Electrode; H1 . . . First Opening; H2 . . . Second Opening; Lm . . . Minimum Surface Distance; PC . . . Center; PR . . . Resist Layer; RC . . . Center Section; RE . . . Edge Section; RM . . . Resist Mask; SH . . . Step Height; SP . . . Support; TM . . . Intermediate Transfer Substrate; ZE . . . Non-Measurement Area; ZL . . . Measurement Area; EPS . . . Electrode Surface; 1 . . . Vapor Deposition Mask Substrate; 1a . . . Base Material; 1b . . . Rolled Material; 1Sa and 321 . . . First Surface; 1Sb and 322 . . . Second Surface; 2M . . . Measurement substrate; 2a . . . First Through-Hole; 2S . . . Surface; 3a . . . Second Through-Hole; 4 . . . First Protection Layer; 10 . . . Mask Device; 20 . . . Main Frame; 21 . . . Main Frame Hole; 30 . . . Vapor Deposition Mask; 31 . . . Frame Portion; 31E . . . Inner Edge Section; 32, 32A, 32B and 32C . . . Mask Portion; 32BN . . . Joining Section; 32E . . . Outer Edge Section; 32H . . . Hole; 32K . . . Substrate; 32LH . . . Large Hole; 32SH . . . Small Hole; 33, 33A, 33B and 33C . . . Frame Hole; 50 . . . Rolling Mill; 51 and 52 . . . Roll; 53 . . . Annealing Apparatus; 61 . . . Second Protection Layer; 311 . . . Joining Surface; 312 . . . Non-Joining Surface; 323 . . . Mask Plate

The invention claimed is:

1. A vapor deposition mask substrate, comprising a metal sheet that has a shape of a strip and is configured to be etched to include a plurality of holes so that the metal sheet is used to manufacture a vapor deposition mask, wherein the metal sheet is made of nickel or nickel-iron alloy, the metal sheet has a thickness of between 10 μm and 50 μm inclusive, the metal sheet has shapes that are taken along a longitudinal direction of the metal sheet at different positions in a width direction of the metal sheet and differ from one another, each of the shapes being an undulated shape including protrusions and depressions repeating in the longitudinal direction of the metal sheet, a length in the longitudinal direction of a surface of the metal sheet is a surface distance, a minimum value of surface distances at different positions in the width direction of the metal sheet is a minimum surface distance, a ratio of a difference between a surface distance at each of the different positions in the width direction of the metal sheet and the minimum surface distance to the minimum surface distance is an elongation difference ratio, the metal sheet has a center section and two edge sections, the center section being located between the two edge sections in the width direction of the metal sheet, the length of each edge section in the width direction is 30% of the length of the metal sheet in the width direction, the length of the center section in the width direction is 40% of the length of the metal sheet in the width direction, the elongation difference ratio in the center section of the metal sheet is less than or equal to $3 \times 10^{-5}$, the elongation difference ratios in two edge sections of the metal sheet are less than or equal to $15 \times 10^{-5}$, and the elongation difference ratio in at least one of the two edge sections of the metal sheet is less than the elongation difference ratio in the center section of the metal sheet.

2. The vapor deposition mask substrate according to claim 1, wherein the elongation difference ratio in only one of the two edge sections is less than the elongation difference ratio in the center section, and a difference between maximum values of the elongation difference ratios in the two edge sections is between $3 \times 10^{-5}$ and $11 \times 10^{-5}$ inclusive.

3. The vapor deposition mask substrate according to claim 1, wherein the elongation difference ratios in the two edge sections are less than the elongation difference ratio in the center section, and the elongation difference ratios in the two edge sections and the elongation difference ratio in the center section are less than or equal to $1 \times 10^{-5}$.

4. A method for manufacturing a vapor deposition mask substrate according to claim 1, wherein the vapor deposition mask substrate comprises a metal sheet that has a shape of a strip and is configured to be etched to include a plurality of holes so that the metal sheet is used to manufacture a vapor deposition mask, the method comprising:

obtaining the metal sheet by rolling a base material.

5. A method for manufacturing a vapor deposition mask, the method comprising:

forming a resist layer on a vapor deposition mask substrate according to claim 1; and forming a plurality of holes in the vapor deposition mask substrate by etching using the resist layer as a mask to form a mask portion.

6. The method for manufacturing a vapor deposition mask according to claim 5, wherein the mask portion is one of a plurality of mask portions, the mask portions each include a separate side surface including openings of some of the holes, and the method further comprising joining a single frame portion to the side surfaces such that the single frame portion surrounds the holes in the mask portions.

\* \* \* \* \*